(12) United States Patent
Mori et al.

(10) Patent No.: US 7,242,047 B2
(45) Date of Patent: Jul. 10, 2007

(54) MAGNETIC MEMORY ADOPTING SYNTHETIC ANTIFERROMAGNET AS FREE MAGNETIC LAYER

(75) Inventors: Kaoru Mori, Tokyo (JP); Tetsuhiro Suzuki, Tokyo (JP); Yoshiyuki Fukumoto, Tokyo (JP); Sadahiko Miura, Tokyo (JP)

(73) Assignee: NEC Corporation, Tokyo (JP)

( * ) Notice: Subject to any disclaimer, the term of this patent is extended or adjusted under 35 U.S.C. 154(b) by 141 days.

(21) Appl. No.: 11/208,370

(22) Filed: Aug. 19, 2005

(65) Prior Publication Data
US 2006/0038213 A1    Feb. 23, 2006

(30) Foreign Application Priority Data
Aug. 19, 2004    (JP) ............... 2004-240046

(51) Int. Cl.
*H01L 29/76* (2006.01)
(52) U.S. Cl. ............... 257/295; 257/296; 257/E21.665; 438/3
(58) Field of Classification Search ........... 257/295, 257/296; 438/3; 365/158, 171, 189
See application file for complete search history.

(56) References Cited

U.S. PATENT DOCUMENTS

| | | | |
|---|---|---|---|
| 6,233,172 B1 | 5/2001 | Chen et al. | |
| 6,252,796 B1 | 6/2001 | Lenssen et al. | |
| 6,292,389 B1 | 9/2001 | Chen et al. | |
| 6,396,735 B2 | 5/2002 | Michijima et al. | |
| 6,545,906 B1 | 4/2003 | Savtchenko et al. | |
| 6,714,446 B1 | 3/2004 | Engel | |

(Continued)

FOREIGN PATENT DOCUMENTS

EP    1187103    3/2002

(Continued)

OTHER PUBLICATIONS

Tsuji et al., "0.1 μm-Rule MRAM Development Using Double-Layered Hard Mask", IEEE (2001), pp. 799-802.

(Continued)

*Primary Examiner*—Quoc Hoang
(74) *Attorney, Agent, or Firm*—Scully, Scott, Murphy & Presser, P.C.

(57) ABSTRACT

A magnetic memory is composed of: a magnetoresistance element including a free magnetic layer; a first interconnection extending in a first direction obliquely to an easy axis of the free magnetic layer; a second interconnection extending in a second direction substantially orthogonal to the first direction; and a write circuit writing data into the free magnetic layer through developing a first write current on the first interconnection, and then developing a second write current on the second interconnection with the first write current turned on. The free magnetic layer includes: first to N-th ferromagnetic layers and first to (N−1)-th non-magnetic layers with N being equal to or more than 4, the i-th non-magnetic layer being disposed between the i-th and (i+1)-th ferromagnetic layers with i being any of natural numbers equal to or less than N−1. The free magnetic layer is designed so that antiferromagnetic coupling(s) between the j-th and (j+1)-th ferromagnetic layers is stronger than that between the first and second ferromagnetic layers, j being any of integers ranging from 2 to N−2.

19 Claims, 28 Drawing Sheets

U.S. PATENT DOCUMENTS

| | | |
|---|---|---|
| 6,737,619 B2 | 5/2004 | Seghatol et al. |
| 6,737,691 B2 | 5/2004 | Asao |
| 6,803,615 B1 | 10/2004 | Sin et al. |
| 6,944,049 B2 | 9/2005 | Hoenigschmid et al. |
| 2005/0152180 A1* | 7/2005 | Katti .................... 365/158 |

FOREIGN PATENT DOCUMENTS

| | | |
|---|---|---|
| JP | 04-255905 | 9/1992 |
| JP | 10-255231 | 9/1998 |
| JP | 11-054814 | 2/1999 |
| JP | 11-161919 | 6/1999 |
| JP | 2000-150984 | 5/2000 |
| JP | 2000-196165 | 7/2000 |
| JP | 2001-052316 | 2/2001 |
| JP | 2002-124718 | 4/2002 |
| JP | 2002-141583 A | 5/2002 |
| JP | 2002-151758 | 5/2002 |
| JP | 2002-158381 | 5/2002 |
| JP | 2002-176211 | 6/2002 |
| JP | 2002-204002 | 7/2002 |
| JP | 2002-204010 | 7/2002 |
| JP | 2003-86866 | 3/2003 |
| JP | 2003-209226 | 7/2003 |
| JP | 2003-258335 | 9/2003 |
| JP | 2003-298023 | 10/2003 |
| JP | 2004-119903 | 4/2004 |
| JP | 2005-505889 | 2/2005 |
| JP | 2005-086015 | 3/2005 |
| JP | 2005-142508 | 6/2005 |
| WO | WO 03/034437 A2 | 4/2003 |

OTHER PUBLICATIONS

Kula, et al. "Development and Process Control Of Magnetic Tunnel Junctions For Magnetic Random Access Memory Devices", Journal of Applied Physics, (May 15, 2003), vol. 93, No. 10, pp. 8373-8375.

* cited by examiner

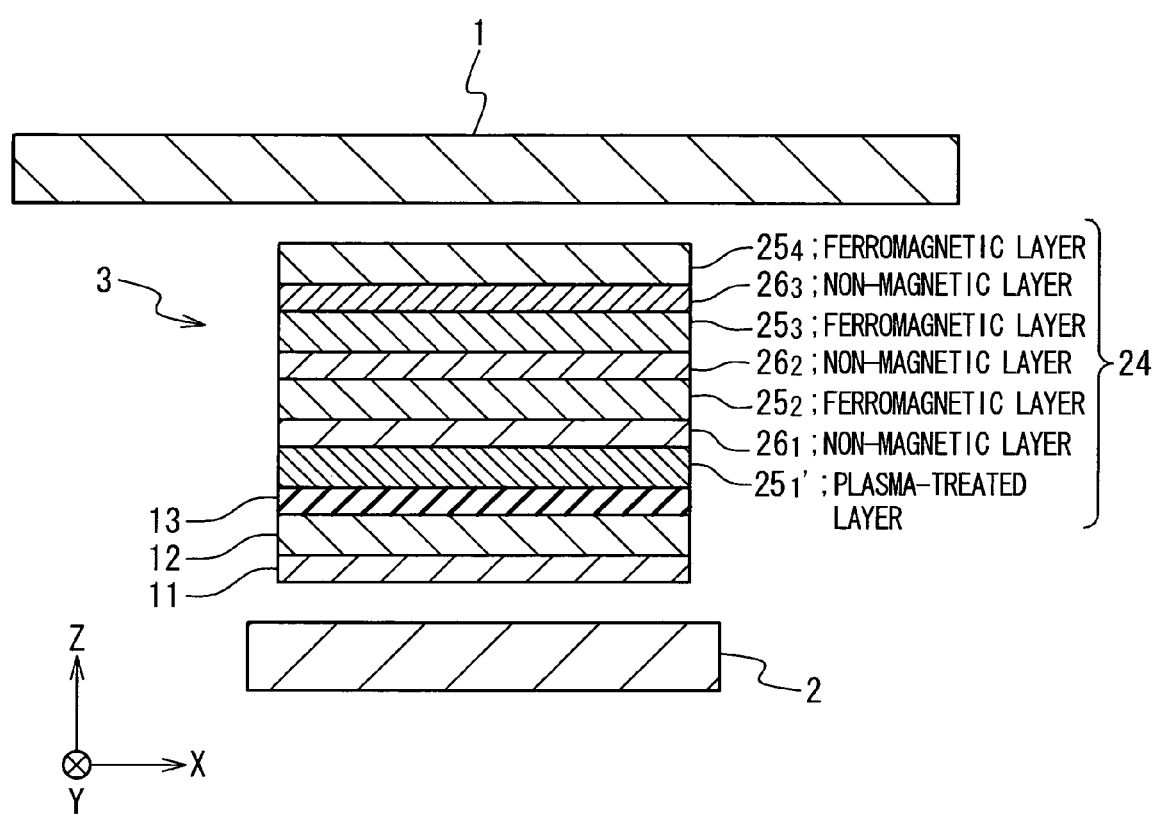

Fig. 25

| X (nm) | FLOP MAGNETIC FIELD (Oe) | SATURATION MAGNETIC FIELD (Oe) |
|---|---|---|
| 0.9 | 62 | 2000> |
| 2.1 | 63 | 1180 |
| NO (TWO FERROMAGNETIC LAYERS) | 62 | 298 |

MAGNETIC MEMORY ADOPTING SYNTHETIC ANTIFERROMAGNET AS FREE MAGNETIC LAYER

BACKGROUND OF THE INVENTION

1. Field of the Invention

The present invention relates to magnetic memories, more particularly to magnetic memories incorporating synthetic antiferromagnet free layers that are composed of multiple ferromagnetic layers separated by non-magnetic layers.

2. Description of the Related Art

The magnetic memory (MRAM) is one of the promising non-volatile semiconductor storage devices. A memory cell of the magnetic memory is typically composed of a magnetoresistance element including a fixed magnetic layer and a free magnetic layer separated by a spacer layer; data is stored as the direction of the magnetization of the free magnetic layer. Reading data from a memory cell is achieved on the basis of the change in the resistance of the magnetoresistance element resulting from the tunneling magnetoresistance (TMR) effect or the Giant magnetoresistance (GMR) effect. A thin insulating layer is used as the spacer layer for a magnetic memory based on the TMR effect, while a thin non-magnetic layer is used for a magnetic memory based on the GMR effect.

One of the issues of magnetic memories is selectivity of memory cells during write operations. A typical magnetic memory achieves writing data into a selected memory cell through developing write currents on selected word and bit lines associated with the selected memory cell. Ideally, data is not written into a half-selected memory cell associated with only one, not both of the selected word and bit lines; however, data may be undesirably written into a half-selected memory cell through variances of the magnetic fields for inversing the magnetization of the free magnetic layer within the memory cell. Avoiding such undesirable data write operations is one of the important issues for developing a commercially-available magnetic memory.

In order to improve the selectivity of memory cells, Savtchenku et al. discloses a technique that adopts synthetic antiferromagnets for free magnetic layers in U.S. Pat. No. 6,545,906; it should be noted that the synthetic antiferromagnet designates a stacked structure composed of two or more ferromagnetic layers separated by one or more intermediate non-magnetic layers, designed so that two adjacent ferromagnetic layers are antiferromagnetically coupled through exchange interaction. Those skilled in the art would appreciate that the antiferromagnetic coupling based on the exchange interaction is achieved by appropriately selecting the thickness and/or the material of the intermediate non-magnetic layer.

An advantage of the use of a synthetic antiferromagnet for a free magnetic layer is that the synthetic antiferromagnet is stable against the external magnetic field. This result from the fact that total magnetic moment of the synthetic antiferromagnet is ideally allowed to be zero; although the term "synthetic antiferromagnet" may generally mean to that which has a certain resultant magnetic moment, the term "synthetic antiferromagnet" in this specification is intended to include that whose the total magnetic moment is zero.

The stability of the synthetic antiferromagnet against the external magnetic field may seem to cause difficulty in data write operations into the free magnetic layer; however, such difficulty is resolved by a special data write operation, referred to as toggle writing, hereinafter, as disclosed by Savtchenku et al.

FIG. 1 is a section view illustrating the structure of an MRAM memory array adapted to toggle writing disclosed by Savtchenku et al., and FIG. 2 is a plan view illustrating the structure of the MRAM memory array. As shown in FIG. 1, the MRAM memory array is composed of a word line 101, a bit line 102, and a memory cell 103 connected between the word line 101 and the bit line 102; those skilled in the art would understand that FIG. 1 partially illustrates the structure of the MRAM memory array, which incorporates a plurality of word lines, bit lines, and memory cells. The memory cell 103 incorporates a fixed magnetic layer 104, a free magnetic layer 105, and a tunnel barrier layer 106 disposed therebetween. The fixed magnetic layer 104 and the free magnetic layer 105 is each composed of a synthetic antiferromagnet; the fixed magnetic layer 104 is formed of a pair of ferromagnetic layers 111 and 112 separated by a non-magnetic layer 113, and the free magnetic layer is formed of a pair of ferromagnetic layers 114 and 115 separated by a non-magnetic layer 116. Hereinafter, magnetizations of the ferromagnetic layers 114 and 115 are denoted by symbols $M_1$, and $M_2$, respectively, and a resultant magnetization of the free magnetic layer 105 is referred to as a symbol $M_R$.

As shown in FIG. 2, the easy axes of the ferromagnetic layers 114 and 115 are directed at an angle of 45° with respect to the word and bit lines 101 and 102. The magnetization $M_1$ of the ferromagnetic layer 114 is directed anti-parallel to the magnetization $M_2$ of the ferromagnetic layer 115. FIGS. 3 and 4 illustrate a procedure of the toggle writing disclosed by Savtchenku et al. As shown in FIG. 2, an x-y coordinate system is defined for easy understanding in the following. The x-axis is defined along the word line 101, while the y-axis is defined along the bit line 102.

Referring to FIG. 3, the toggle writing operation begins with developing a current $I_{WL}$ directed in the positive x-direction on the word line 101 at a time $t_1$. As shown in FIG. 4, the current $I_{WL}$ induces a magnetic field $H_{WL}$ in the positive y-direction, and the developed magnetic field $H_{WL}$ slightly rotates the magnetizations $M_1$ and $M_2$ of the ferromagnetic layers 114 and 115 toward the positive y-direction. The rotation angles of the magnetizations $M_1$ and $M_2$ are determined so that the resultant magnetization $M_R$ is directed in parallel with the +y direction.

As shown in FIG. 3, this is followed by developing a current $I_{BL}$ directed in the +y direction on the bit line 102 at a time $t_2$. As shown in FIG. 4, developing the current $I_{BL}$ results in developing a synthetic magnetic field $H_{WL}+H_{BL}$ directed at an angle of 45° with respect to the x and y axes. The synthetic magnetic field $H_{WL}+H_{BL}$ rotates the magnetizations $M_1$ and $M_2$ in a clockwise direction so that the resultant magnetization $M_R$ thereof is directed in parallel with the synthetic magnetic field $H_{WL}+H_{BL}$.

The current $I_{WL}$ on the word line 101 is then terminated at a time $t_3$. The termination of the current $I_{WL}$ results in only the magnetic field $H_{BL}$, directed in the positive x-direction, is effected on the ferromagnetic layers 114 and 115. The magnetic field $H_{BL}$ further rotates the magnetizations $M_1$ and $M_2$ so that the resultant magnetization $M_R$ thereof is directed in parallel with the magnetic $H_{BL}$.

Finally, the current $I_{BL}$ on the bit line 102 is then terminated at a time $t_4$. The termination of the current $I_{BL}$ removes the magnetic field from the magnetizations $M_1$ and $M_2$, allowing the magnetizations $M_1$ and $M_2$ to be directed in parallel with the easy axes. As a result, the magnetizations $M_1$ and $M_2$ are reversed into the opposite directions to the original directions thereof. It should be noted that the toggle writing reverses the magnetizations $M_1$ and $M_2$, independently of the original directions thereof.

For the practical application, it is important to reduce the magnetic field necessary for reversing the magnetizations within the free magnetic layer 105 (which may be referred to as the spin-flop field, hereinafter), that is, the current level of the write currents developed on the word and bit lines 101 and 102.

Engel discloses a technique for reducing the current level necessary for "toggling" the magnetizations within the synthetic antiferromagnet, in U.S. Pat. No. 6,714,446. As shown in FIG. 5, the Engel's magnetic memory is composed of a free magnetic layer 105 which includes a synthetic antiferromagnet 114 formed of ferromagnetic layers 114a and 114b separated by a non-magnetic layer 114c; a synthetic antiferromagnet 115 formed of ferromagnetic layers 115a and 115b separated by a non-magnetic layer 115c, and a non-magnetic layer 116 disposed between the synthetic antiferromagnets 114 and 115.

Although U.S. Pat. No. 6,545,906 disclosed that there are no upper limits of magnetic fields for achieving the toggle writing, an inventors' study has proved that there are upper limits of magnetic fields for successfully achieving the toggle writing. More specifically, the magnetizations of the ferromagnetic layers within the free magnetic layer are aligned in the same direction, when excessively large magnetic fields are applied to the free magnetic layer along the word and bit lines; directing the magnetizations within the free magnetic layer in the same direction causes uncertainty of the directions of the magnetizations after the removal of the magnetic fields, unsuccessfully completing the toggle writing. Improvement in the stability of the toggle writing requires increasing the upper limits of magnetic fields for successfully achieving the toggle writing.

There is a need for increasing the upper limits of magnetic fields for successfully achieving the toggle writing, and thereby improving the operation range of the magnetic memory.

SUMMARY OF THE INVENTION

Therefore, an object of the present invention is to improve the operation range of magnetic memories adapted to toggle writing.

Generally, the present invention addresses increasing the magnetic field which causes magnetizations of ferromagnetic layers within a synthetic antiferromagnet to be directed in the same direction; such magnetic field is referred to as the saturation magnetic field, hereinafter. This is based on the fact that the upper limits of the magnetic fields for achieving successful toggle writing are dependent on the saturation magnetic field of the free magnetic layer. A reduced saturation magnetic field allows the magnetizations of the ferromagnetic layers within the free magnetic layer to be easily directed to the same direction. This causes uncertainty of the directions of the magnetizations after the removal of the magnetic fields, unsuccessfully completing the toggle writing. Increasing the saturation magnetic field of the free magnetic layer is important for improving the operation range of magnetic memories.

In an aspect of the present invention, a magnetic memory is composed of: a magnetoresistance element including a free magnetic layer; a first interconnection extending in a first direction obliquely to an easy axis of the free magnetic layer; a second interconnection extending in a second direction substantially orthogonal to the first direction; and a write circuit writing data into the free magnetic layer through developing a first write current on the first interconnection, and then developing a second write current on the second interconnection with the first write current turned on. The free magnetic layer includes: first to N-th ferromagnetic layers, and first to (N−1)-th non-magnetic layers with N being equal to or more than 4, the i-th non-magnetic layer being disposed between the i-th and (i+1)-th ferromagnetic layers with i being any of natural numbers equal to or less than N−1. The free magnetic layer is designed so that antiferromagnetic coupling(s) between the j-th and (j+1)-th ferromagnetic layers is stronger than that between the first and second ferromagnetic layers, j being any of integers ranging from 2 to N−2.

The spin-flop field of the free magnetic layer mainly depends on the antiferromagnetic coupling between the first and second ferromagnetic layers, while the saturation magnetic field of the free magnetic layer mainly depends on the antiferromagnetic coupling(s) between the remaining pair(s) of the ferromagnetic layers. Therefore, the above-described structure of the magnetic memory in accordance with the present invention effectively increases the saturation magnetic field of the free magnetic layer with the spin-flop field thereof reduced.

Preferably, the free magnetic layer is designed so that the antiferromagnetic coupling(s) between the j-th and (j+1)-th ferromagnetic layers is stronger than that between the (N−1)-th and N-th ferromagnetic layers, j being any of integers ranging from 2 to N−2. This promotes the ferromagnetic layers to operate as a single synthetic antiferromagnet, and thereby stabilizes toggle writing operation.

In another aspect of the present invention, a magnetic memory is composed of: a magnetoresistance element including a free magnetic layer; a first interconnection extending in a first direction obliquely to an easy axis of the free magnetic layer; a second interconnection extending in a second direction substantially orthogonal to the first direction; and a write circuit writing data into the free magnetic layer through developing a first write current on the first interconnection, and then developing a second write current on the second interconnection with the first write current turned on. The free magnetic layer includes: first to third ferromagnetic layers; first non-magnetic layer disposed between the first and second ferromagnetic layers; and second non-magnetic layer disposed between the second and third ferromagnetic layers. The free magnetic layer is designed so that antiferromagnetic coupling between the first and second ferromagnetic layers is stronger than that between the second and third ferromagnetic layers.

In still another aspect of the present invention, a magnetic memory is composed of a magnetoresistance element including a free magnetic layer; a first interconnection extending in a first direction obliquely to an easy axis of the free magnetic layer; a second interconnection extending in a second direction substantially orthogonal to the first direction; and a write circuit writing data into the free magnetic layer through developing a first write current on the first interconnection, and then developing a second write current on the second interconnection with the first write current turned on. The free magnetic layer includes: first to N-th ferromagnetic layers, N being equal to or more than 3; and first to (N−1)-th non-magnetic layers, the i-th non-magnetic layer being disposed between the i-th and (i+1)-th ferromagnetic layers, i being any of natural numbers equal to or less than N−1. The free ferromagnetic layer is designed so that a saturation magnetic field of the free ferromagnetic layer is larger than twice of that of a synthetic antiferromagnet composed of a pair of ferromagnetic layers equivalent to the first and second ferromagnetic layers, and a non-magnetic layer equivalent to the first non-magnetic layer.

Preferably, the free ferromagnetic layer is designed so that a magnetization curve of the free ferromagnetic layer is constantly convex upward.

BRIEF DESCRIPTION OF THE DRAWINGS

The above and other advantages and features of the present invention will be more apparent from the following description taken in conjunction with the accompanied drawings, in which:

FIGS. 10 to 12, 13A, 13B, 14 and 15 are a section views illustrating other exemplary structures of the magnetic memory in the first embodiment;

FIG. 25 is a table illustrating spin-flop fields and saturation magnetic fields of the magnetoresistance elements associated with the comparative example, and the embodiments of the present invention.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

First Embodiment

Figure 1:
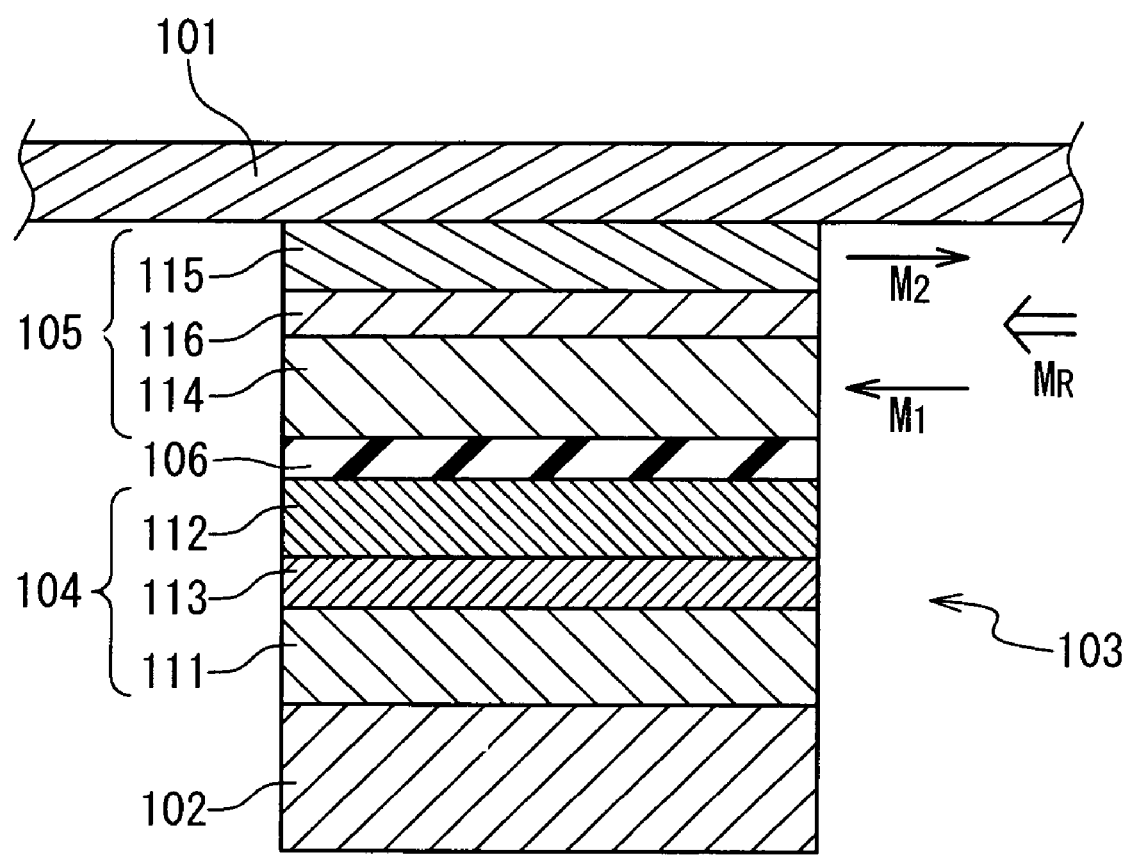
FIG. 1 is a section view illustrating a structure of a conventional magnetic memory adapted to toggle writing.
Figure 2:
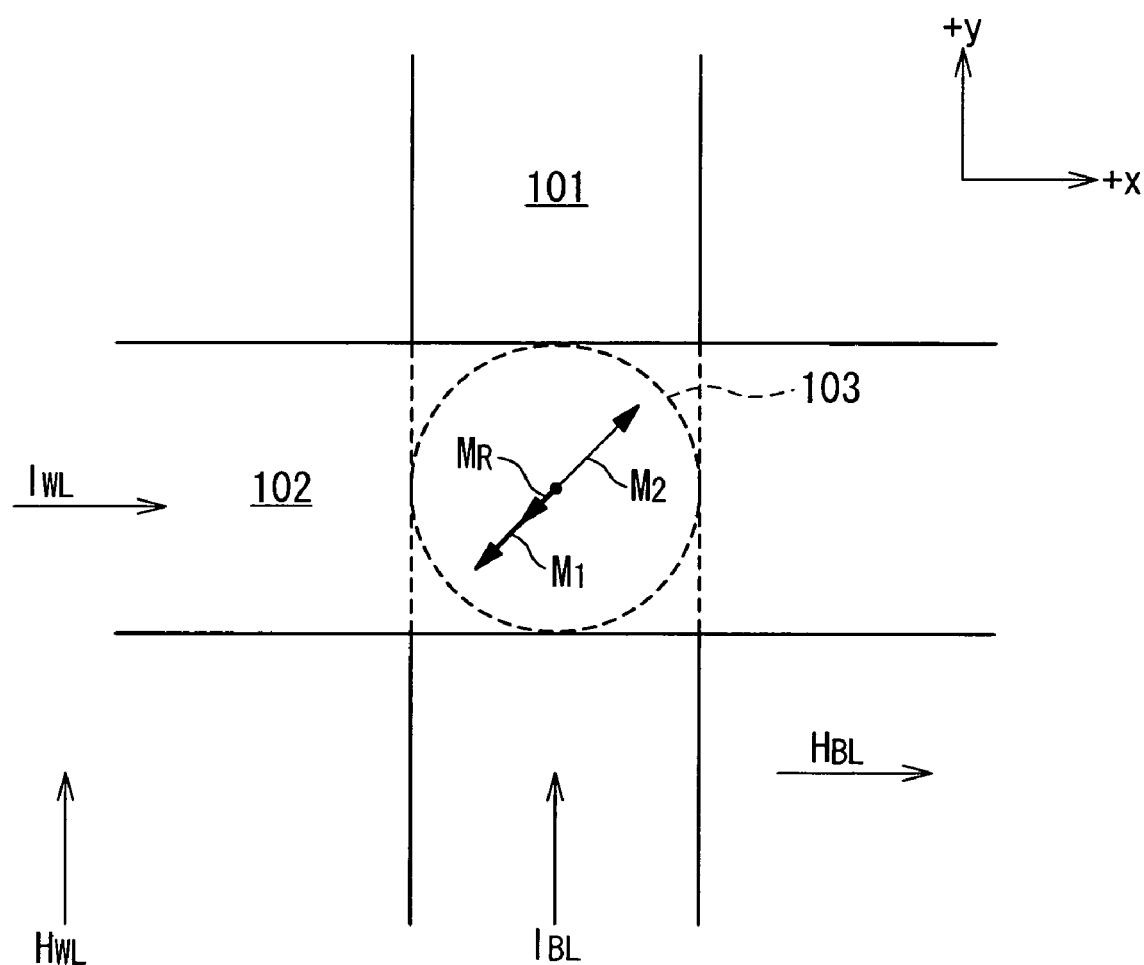
FIG. 2 is a plan view illustrating a structure of the conventional magnetic memory adapted to the toggle writing.
Figure 3:
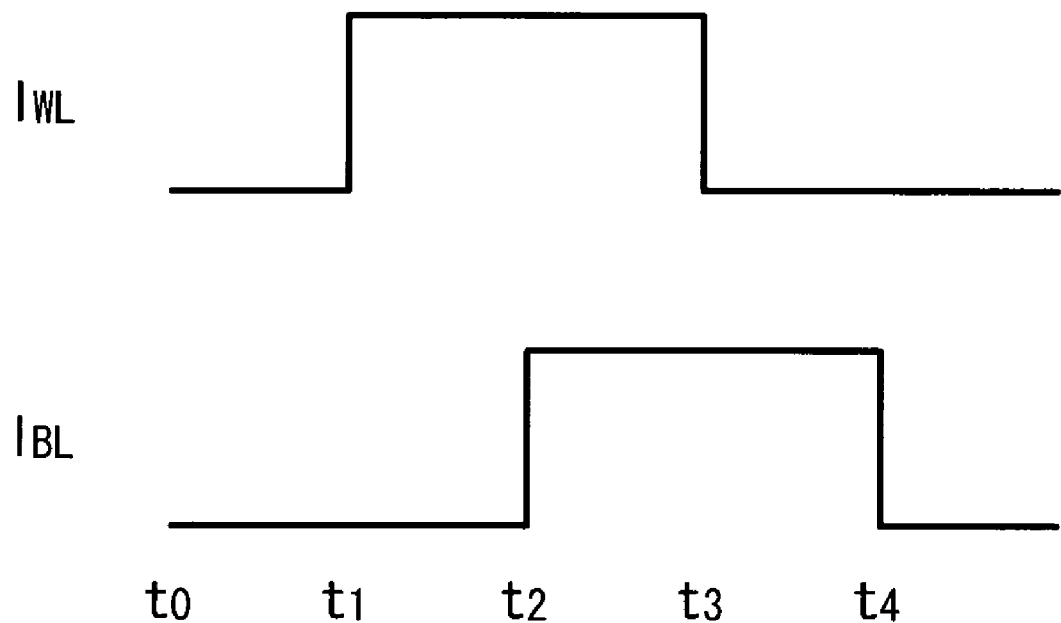
FIG. 3 is a timing chart illustrating a procedure of the toggle writing.
Figure 4:
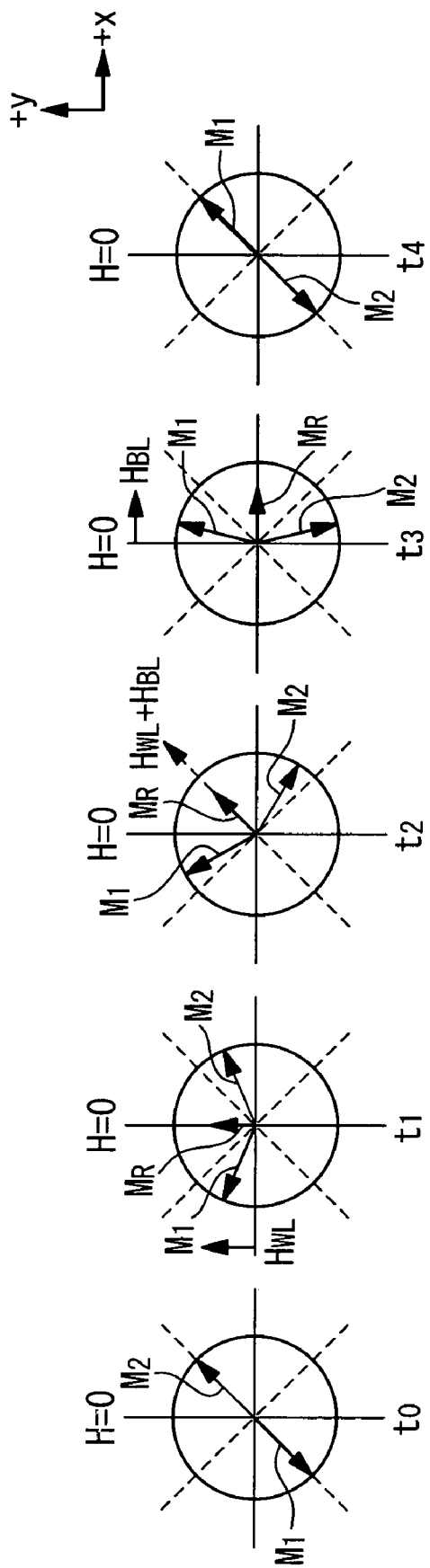
FIG. 4 is a conceptional diagram illustrating the behaviors of magnetizations of ferromagnetic layers during toggle write operation.
Figure 5:
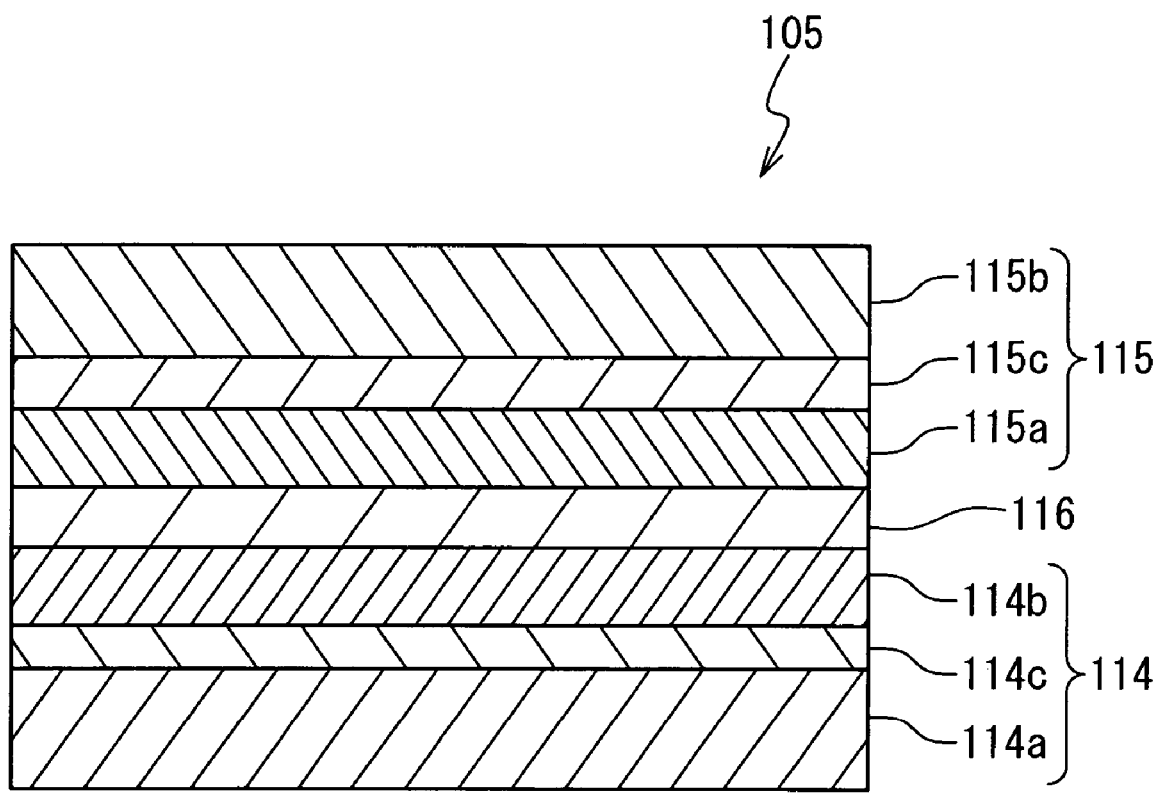
FIG. 5 is a section view illustrating another structure of a conventional magnetic memory adapted to the toggle writing.
Figure 6:
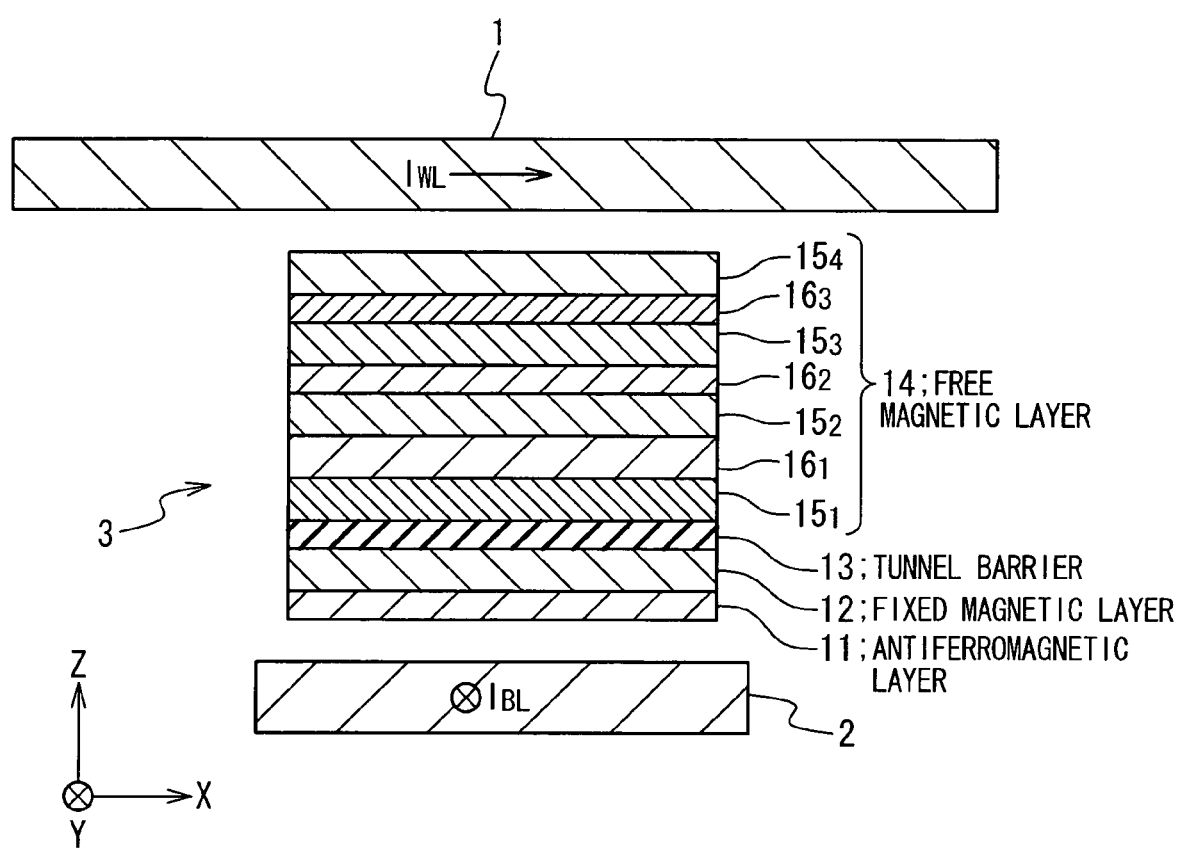
FIG. 6 is a section view illustrating an exemplary structure of a magnetic memory in a first embodiment of the present invention.

FIG. 6 is a section view illustrating an exemplary structure of a magnetic memory in a first embodiment of the present invention. The magnetic memory is composed of a word line 1, a bit line 2, and a magnetoresistance element 3, used as a memory cell. It will be understood that FIG. 6 partially illustrates the structure of the magnetic memory, and the magnetic memory is actually composed of a number of word lines 1, bit lines 2, and magnetoresistance elements 3. The word line 1 and the bit line 2 are extended in substantially orthogonal directions; in this embodiment, an x-axis direction is defined along the word line 1, and a y-axis direction is defined along the bit line 2. The word line 1 and the bit line 2 are connected to a write circuit (not shown) that provides a set of write currents $I_{WL}$ and $I_{BL}$ for the word line 1 and the bit line 2, respectively. In one embodiment, the write circuit is composed of decoders, and current sources developing the write currents $I_{WL}$ and $I_{BL}$, respectively. The magnetoresistance element 3 is composed of an antiferromagnetic layer 11, a fixed magnetic layer 12, a tunnel barrier 13, and a free magnetic layer 14. The fixed magnetic layer 12 may be formed of a ferromagnetic layer or a synthetic antiferromagnet with the magnetization(s) fixed by the antiferromagnetic layer 11. The easy axis of the ferromagnetic layer (or the easy axes of the synthetic antiferromagnet) is directed at an angle of 45° with respect to the word line 1 and the bit line 2. The tunnel barrier 13 is a thin dielectric layer disposed between the fixed magnetic layer 12 and the free magnetic layer 14. The thickness of the tunnel barrier 13 is sufficiently reduced to allow a tunnel current to flow therethrough.

The free magnetic layer 14 within the magnetoresistance element 3 is composed of a synthetic antiferromagnet. In this embodiment, the free magnetic layer 14 incorporates four ferromagnetic layers $15_1$ to $15_4$, and three non-magnetic layers $16_1$ to $16_3$. The ferromagnetic layers $15_1$ to $15_4$ are separated by the non-magnetic layers $16_1$ to $16_3$. The easy axes of the ferromagnetic layers $15_1$ to $15_4$ are directed at an angle of 45° with respect to the word line 1 and the bit line 2. Adjacent ferromagnetic layers are antiferromagnetically coupled within the free magnetic layer 14; the magnetizations of the adjacent ferromagnetic layers are opposite to each other. Maintaining the magnetizations of the adjacent ferromagnetic layers in opposite directions is of much importance for successfully achieving toggle writing. It should be noted that, antiferromagnetic coupling means to include both of exchange interaction coupling and magnetostatic coupling caused by magnetic poles developed at the ends of the ferromagnetic layers. The strengths of exchange interaction effected among the ferromagnetic layers $15_1$ to $15_4$ are dependent on constituent materials and thicknesses of the non-magnetic layers $16_1$ to $16_3$. The non-magnetic layers $16_1$ to $16_3$ are each formed of appropriate material with an appropriate thickness so that the adjacent ferromagnetic layers are antiferromagnetically coupled through exchange interaction. The strengths of the magnetostatic coupling, on the other hand, depend on constituent materials and thicknesses of the ferromagnetic layers $15_1$ to $15_4$.

The data write operation of the magnetic memory shown in FIG. 6 is based on toggle writing, which is above-described in the Description of the Related Art. The data write operation based on toggle writing begins with reading data from a selected memory cell. This is followed by comparing write data with the data read from the selected memory cell. When the write data is not identical to the data read from the selected memory cell, the magnetizations of the ferromagnetic layers $15_1$ to $15_4$ within the free magnetic layer 14 are reversed. The reverse of the magnetizations of the ferromagnetic layers $15_1$ to $15_4$ begins with developing a write current $I_{WL}$ on the word line 1. A write current $I_{BL}$ is then additionally developed on the bit line 2 with the write current $I_{WL}$ turned on. This is followed by terminating the write current $I_{WL}$ with the write current $I_{BL}$ turned on. Finally, the write current $I_{BL}$ is terminated to complete the reverse of the magnetizations of the ferromagnetic layers $15_1$ to $15_4$.

Figure 8A:
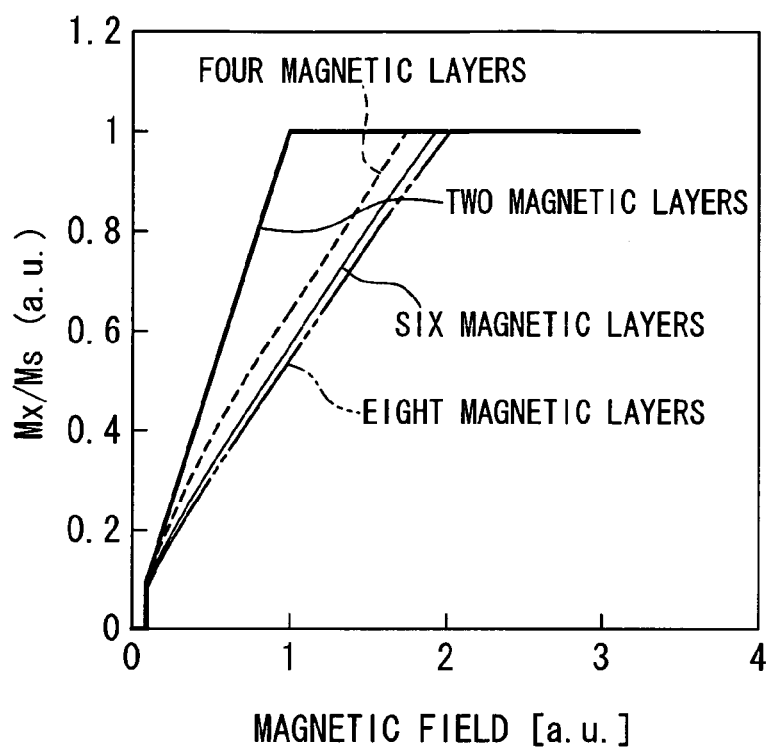
FIG. 8A is a graph illustrating the dependence of the magnetization curve of a synthetic antiferromagnet on the number of ferromagnetic layers within the synthetic antiferromagnet.
Figure 8B:
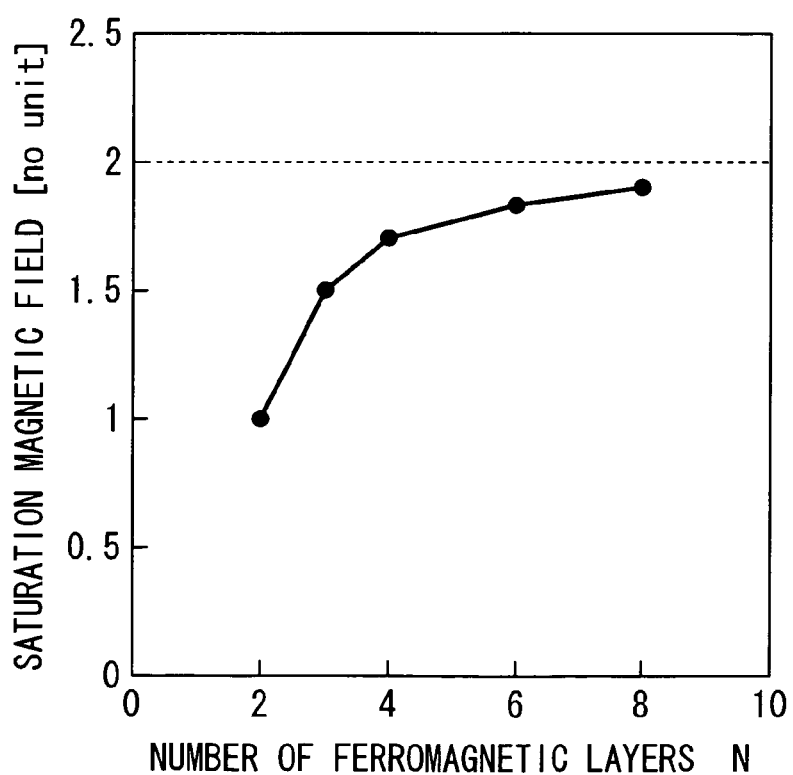
FIG. 8B is a graph illustrating the dependence of the saturation magnetic field of the synthetic antiferromagnet on the number of ferromagnetic layers within the synthetic antiferromagnet.

It is important for improving the write operation range of the magnetic memory adapted to toggle writing that the number of the ferromagnetic layers within the free magnetic layer 3 is increased equal to or exceeding three, because this effectively increases the saturation magnetic field of the free magnetic layer 14. FIG. 8A is a graph illustrating the effect of the increase in the number of ferromagnetic layers, more specifically, associations of resultant magnetizations Mx of antiferromagnets having different numbers of ferromagnetic layers with intensities of magnetic fields applied to the antiferromagnets. In FIG. 8A, the resultant magnetizations Mx are normalized by the saturated magnetization Ms of the synthetic antiferromagnets (that is, the magnetizations of the synthetic antiferromagnets with the magnetizations of the ferromagnetic layers oriented in the same direction); the saturation magnetic field is defined as being the magnetic field at which Mx/Ms equals one. It should be noted that the graph of FIG. 8A is obtained through a Landau-Lifshitz simulation under conditions in which the synthetic antiferromagnets are composed of ferromagnetic layers of the same material and thickness, and intermediate non-magnetic layers of the same material and thickness. As shown in FIG. 8A, the saturation magnetic field increases as the increase in the number of the ferromagnetic layers within the synthetic antiferromagnets. FIG. 8B is a graph illustrating an effect of the number of the ferromagnetic layers on the saturation magnetic field of the synthetic antiferromagnet. The increase in the saturation magnetic field of the synthetic antiferromagnets exhibits saturation at twice of the saturation magnetic field of the synthetic antiferromagnet incorporating two ferromagnetic layers.

An additional approach for improving the operation range of the magnetic field in this embodiment is that a special design of the free magnetic layer 14 with respect to the strengths of the antiferromagnetic couplings within the free magnetic layer 14. More specifically, the free magnetic layer 14 is designed so that the strengths of the antiferromagnetic couplings between the ferromagnetic layers $15_2$ and $15_3$ and between the ferromagnetic layers $15_3$ and $15_4$ are stronger than that between the ferromagnetic layers $15_1$ and $15_2$. The effect of such design will be described in detail later.

Figure 7:
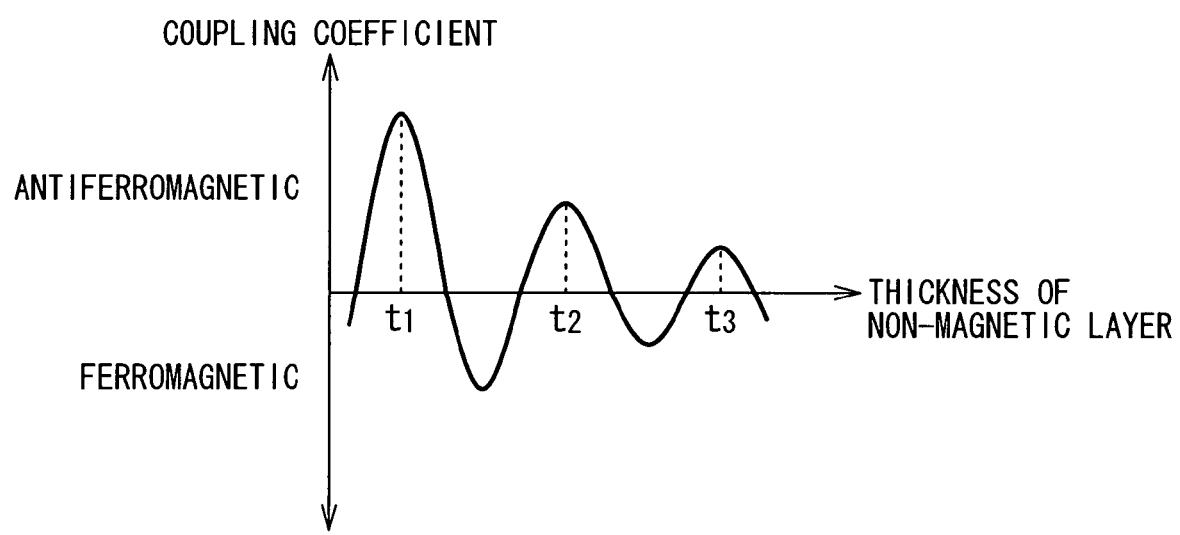
FIG. 7 is a graph illustrating the dependence of the coupling coefficient of the exchange interaction on a thickness of a non-magnetic layer.

The magnetic memory shown in FIG. 6 achieves control of the antiferromagnetic couplings between adjacent ferromagnetic layers through appropriately adjusting the thicknesses of the non-magnetic layers $16_1$ to $16_3$. Specifically, the thicknesses of the non-magnetic layers $16_1$ to $16_3$ are adjusted so that the antiferromagnetic exchange interactions between the ferromagnetic layers $15_2$ and $15_3$ and between the ferromagnetic layers $15_3$ and $15_4$ are stronger than that between the ferromagnetic layers $15_1$ and $15_2$. It should be noted that the strength of the exchange coupling exhibits damped oscillation as the increase in the thickness of the intermediate non-magnetic layer as shown in FIG. 7, in which the coupling coefficient is defined as being positive for the antiferromagnetic coupling. The antiferromagnetic couplings between the adjacent ferromagnetic layers are adjusted on the basis of the dependence of the coupling coefficients on the thicknesses of the intermediate non-magnetic layers.

More specifically, the thicknesses of the non-magnetic layers $16_2$ and $16_3$ are adjusted to the thickness $t_1$ corresponding to the first antiferromagnetic peak of the coupling coefficient of the exchange interaction, while the thickness of the non-magnetic layer $16_1$ is adjusted to the thickness $t_2$ corresponding to the second antiferromagnetic peak; it should be noted that the thickness $t_2$ is larger than the thickness $t_1$. Such arrangement provides a relatively weak antiferromagnetic exchange interaction between the ferromagnetic layers $15_1$ and $15_2$, and relatively strong antiferromagnetic exchange interactions between the ferromagnetic layers $15_2$ and $15_3$ and between the ferromagnetic layers $15_3$ and $15_4$. It should be additionally noted that adjusting the thicknesses of the non-magnetic layers to those corresponding to extremums of the coupling coefficient is effective for improving the stability of the strengths of the antiferromagnetic exchange interactions within the free magnetic layer 14.

The thus-described optimization of the strengths of the antiferromagnetic couplings effectively increases the saturation magnetic field of the free magnetic layer 14 with the reduced spin-flop field, which is identical to the magnetic field necessary for reversing the ferromagnetic layers within the free magnetic layer 14. This results from the fact that the spin-flop field of the free magnetic layer 14 mainly depends on the weakest one of the antiferromagnetic couplings within the free magnetic layer 14, while the saturation magnetic field of the free magnetic layer 14 mainly depends on the relatively strong ones of the antiferromagnetic couplings within the free magnetic layer 14. The relatively weak antiferromagnetic coupling between the ferromagnetic layers $15_1$ and $15_2$ causes the magnetization of the ferromagnetic layer $15_1$ to be reversed most easily. This effectively reduces the spin-flop field of the free magnetic layer 14 as a whole, because the spin-flop field of the free magnetic layer 14 mainly depends on the reversing magnetic field associated with the ferromagnetic layer having the most easily reversible magnetization. Additionally, the relatively strong antiferromagnetic couplings between the ferromagnetic layers $15_2$ and $15_3$ and between the ferromagnetic layers $15_3$ and $15_4$ effectively increase the saturation magnetic field of the free magnetic layer 14.

It would be undesirable that the pair of the ferromagnetic layers coupled by the relatively weak antiferromagnetic coupling is positioned at the intermediate location within the free magnetic layer 14. More specifically, it is not preferable that the non-magnetic layer $16_2$ exhibits the relatively weak exchange interaction in place of the non-magnetic layer $16_1$, because such design may cause the free magnetic 14 to operate as independent multiple ferromagnetic layers separated by the non-magnetic layer which exhibits the relatively weak exchange interaction; in other words, such design may inhibit the free magnetic layer 14 from operating a single synthetic antiferromagnet as a whole, leading to an unsuccessful toggle writing operation.

Figure 9A:
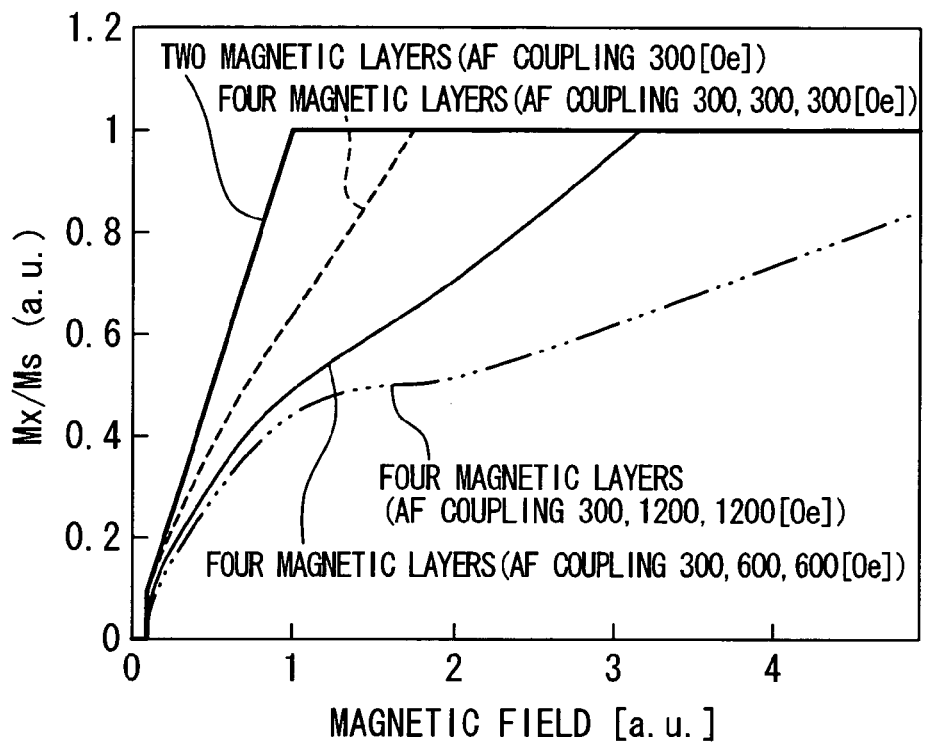
FIG. 9A is a graph illustrating an effect of optimization of strengths of antiferromagnetic couplings on the magnetization curve of the free magnetic layer.

FIG. 9A is a graph proving the effect of the optimization of the strengths of the antiferromagnetic couplings within the free magnetic layer 14, illustrating the dependence of magnetization curves of the free ferromagnetic layer 14 on the strengths of the antiferromagnetic couplings between the ferromagnetic layers $15_2$ and $15_3$, and between the ferromagnetic layers $15_3$ and $15_4$. The graph of FIG. 9A is obtained through a Landau-Lifshitz simulation. It should be noted that the resultant magnetization Mx of the free magnetic layer 14 is normalized by the saturated magnetization Ms in FIG. 14. The risings of the magnetization curves indicate the spin-flop field of the free magnetic layer 14, and the magnetic field at which Mx/Ms equals one indicates the saturation magnetic field of the free magnetic layer 14.

The legend "FOUR MAGNETIC LAYERS (AF COUPLING 300, 300, 300 [Oe])" indicates the magnetization curve of the free magnetic layer 14 in which the strengths of the antiferromagnetic couplings between the ferromagnetic layers $15_1$ and $15_2$, between the ferromagnetic layers $15_2$ and $15_3$, and between the ferromagnetic layers $15_3$ and $15_4$ are each equivalent to a coupling magnetic field of 300 [Oe]. This magnetization curve indicates the effect of the increase in the saturation magnetic field of the free magnetic layer 14 resulting from the increase in the number of the ferromagnetic layers. Correspondingly, the legend "FOUR MAGNETIC LAYERS (AF COUPLING 300, 600, 600 [Oe])" indicates the magnetization curve of the free magnetic layer 14 in which the strength of the antiferromagnetic coupling between the ferromagnetic layers $15_1$ and $15_2$ is equivalent to a coupling magnetic field of 300 [Oe], and the strengths of the antiferromagnetic couplings between the ferromagnetic layers $15_2$ and $15_3$ and between the ferromagnetic layers $15_3$ and $15_4$ are equivalent to a coupling magnetic field of 600 [Oe]. Furthermore, the legend "FOUR MAGNETIC LAYERS (AF COUPLING 300, 1200, 1200 [Oe])" indicates the magnetization curve of the free magnetic layer 14 in which the strengths of the antiferromagnetic couplings between the ferromagnetic layers $15_2$ and $15_3$ and between the ferromagnetic layers $15_3$ and $15_4$ are equivalent to a coupling magnetic field of 1200 [Oe] instead of 600 [Oe]. It should be noted that the strength of the antiferromagnetic coupling between ferromagnetic layers $15_1$ and $15_2$ is fixedly 300 [Oe] for all the magnetization curves. Finally, the legend "TWO MAGNETIC LAYERS (AF COUPLING 300 [Oe])" indicates a magnetization curve of a comparative synthetic antiferromagnet consists of a pair of ferromagnetic layers coupled by antiferromagnetic coupling of a strength corresponding to a coupling magnetic field of 300 [Oe], the comparative synthetic antiferromagnet being associated with a tri-layer structure composed of ferromagnetic layers $15_1$ and $15_2$ separated by a non-magnetic layer $16_1$.

As is understood from FIG. 9A, enhancing the antiferromagnetic couplings between the ferromagnetic layers $15_2$ and $15_3$ and between the ferromagnetic layers $15_3$ and $15_4$ compared to that between the ferromagnetic layers $15_1$ and $15_2$ effectively increases the saturation magnetic field of the free ferromagnetic layer 14. Quantitatively, the optimization of the strengths of the antiferromagnetic couplings allows increasing the saturation magnetic field of the free ferromagnetic layer 14 over twice of that of the synthetic antiferromagnet consisting only of the ferromagnetic layers $15_1$ and $15_2$ and the non-magnetic layer $16_1$. This implies that the optimization of the strengths of the antiferromagnetic couplings has an effect of enhancing the increase in the saturation magnetic field, exceedingly over the effect of the increase in the number of the ferromagnetic layers; as described with reference to FIG. 8B, the increase in the saturation magnetic field exhibits saturation at twice of the saturation magnetic field of the synthetic antiferromagnet consisting of two ferromagnetic layers separated by a non-magnetic layer.

The increase in the spin-flop field of the free magnetic layer 14, on the other hand, is suppressed by the relatively weak antiferromagnetic coupling between the ferromagnetic layers $15_1$ and $15_2$. Enhancing the antiferromagnetic couplings between the ferromagnetic layers $15_2$ and $15_3$ and between the ferromagnetic layers $15_3$ and $15_4$ does not cause undesirable increase in the spin-flop field of the free magnetic layer 14.

As thus described, the structure of the free magnetic layer 14 shown in FIG. 6 achieves the saturation magnetic field of the free magnetic layer 14 with the spin-flop field thereof reduced.

It should be noted that it is no desirable that the antiferromagnetic couplings between the ferromagnetic layers $15_2$ and $15_3$ and between the ferromagnetic layers $15_3$ and $15_4$ are excessively enhanced. As shown in FIG. 9A, an inflexion point appears in the magnetization curve when the strengths of the antiferromagnetic couplings between the ferromagnetic layers $15_2$ and $15_3$ and between the ferromagnetic layers $15_3$ and $15_4$ are largely different from that between the ferromagnetic layers $15_1$ and $15_2$. The inflexion point in the magnetization curve implies that the behavior of the magnetization of the ferromagnetic layer $15_1$ is independent from those of the remaining ferromagnetic layers $15_2$ to $15_4$. This is undesirable for successful toggle writing. For example, an inflexion point appears in the magnetization curve associated with the free magnetic layer structure in which the antiferromagnetic couplings between the ferromagnetic layers $15_2$ and $15_3$ and between the ferromagnetic layers $15_3$ and $15_4$ have a strength equivalent to a coupling magnetic field of 1200 [Oe]. This concludes that there is an appropriate range for the strengths of the antiferromagnetic couplings between the ferromagnetic layers $15_2$ and $15_3$ and between the ferromagnetic layers $15_3$ and $15_4$.

Figure 9B:
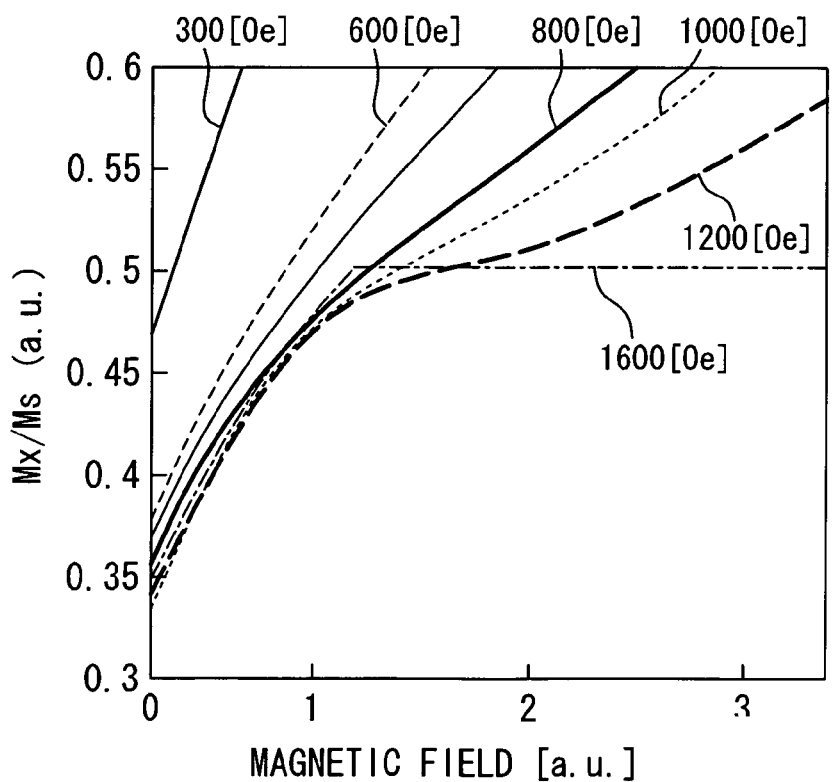
FIG. 9B is an enlarged graph near the inflexion points, illustrating the effect of optimization of strengths of antiferromagnetic couplings on the magnetization curve of the free magnetic layer.

FIG. 9B is an enlarged graph illustrating a region near the inflexion point, indicating the appropriate range for the strengths of the antiferromagnetic couplings between the ferromagnetic layers $15_2$ and $15_3$ and between the ferromagnetic layers $15_3$ and $15_4$. The curves denoted by symbols "X [Oe]" in FIG. 9B represent the magnetization curves of the free ferromagnetic layer 14 in which the antiferromagnetic couplings between the ferromagnetic layers $15_2$ and $15_3$ and between the ferromagnetic layers $15_3$ and $15_4$ have a strength equivalent to a coupling magnetic field of X [Oe]. As shown in FIG. 9B, it is preferable for avoiding the appearance of the inflexion point that the strengths of the antiferromagnetic couplings between the ferromagnetic layers $15_2$ and $15_3$ and between the ferromagnetic layers $15_3$ and $15_4$ are less than three times of the strength of the antiferromagnetic coupling between the ferromagnetic layers $15_1$ and $15_2$.

The strengths of the antiferromagnetic couplings between the adjacent ferromagnetic layers may be adjusted through various approaches other than the adjustment of the thicknesses of the non-magnetic layers $16_1$ to $16_3$. For example, the strengths of the antiferromagnetic couplings between the adjacent ferromagnetic layers may be controlled by selection of the materials of the ferromagnetic layers; the strength of the antiferromagnetic coupling between adjacent ferromagnetic layers depends on the material of the ferromagnetic layers. For example, an increased Co concentration within the ferromagnetic layers separated by a Ru non-magnetic layer enhances the exchange interaction therebetween.

Therefore, an exchange interaction between CoFe ferromagnetic layers is stronger than that between NiFe ferromagnetic layers. Correspondingly, an exchange interaction between NiCoFe ferromagnetic layers with a relatively increased Co concentration is stronger than that between NiCoFe ferromagnetic layers with a relatively decreased Co concentration.

Figure 10:
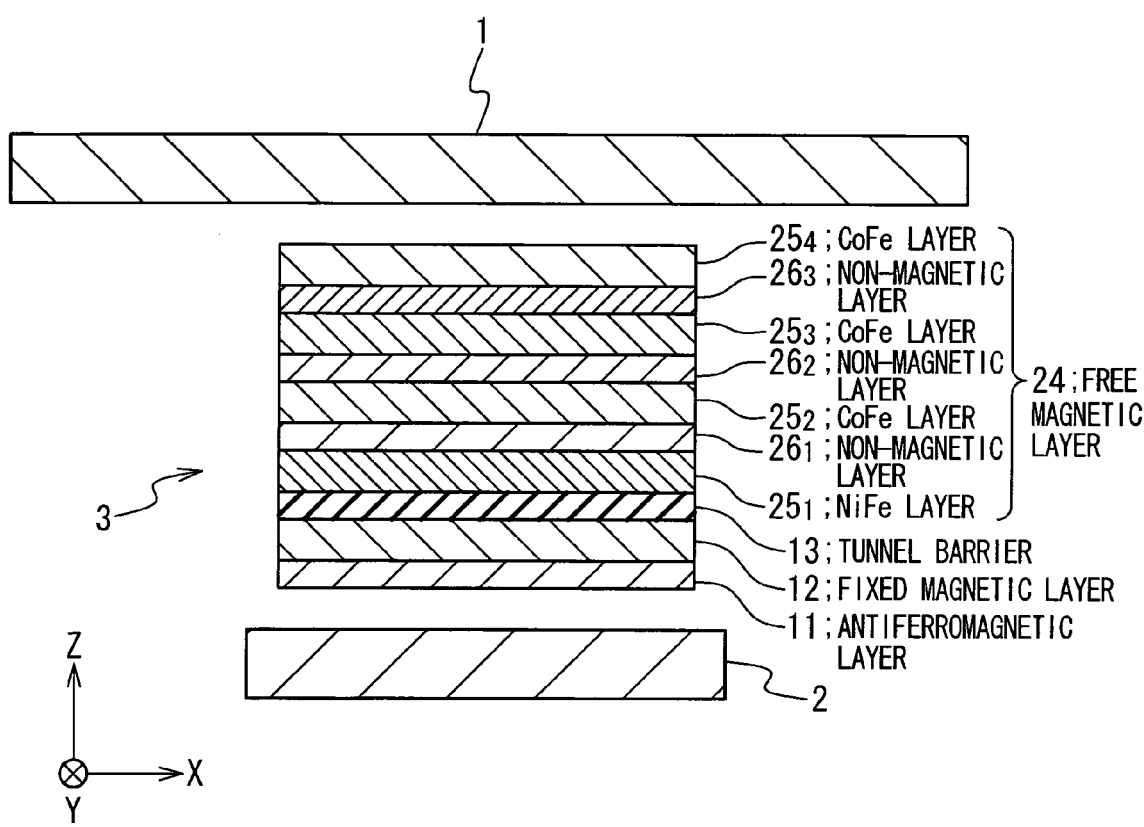

FIG. 10 is an exemplary structure of a free ferromagnetic layer 24 in which strengths of antiferromagnetic couplings between adjacent ferromagnetic layers are controlled on the materials of the ferromagnetic layers. The free ferromagnetic layer 24 is composed of a NiFe ferromagnetic layer $25_1$ and CoFe ferromagnetic layers $25_2$ to $25_4$, which are separated by Ru non-magnetic layers $26_1$ to $26_3$; in the following, the NiFe ferromagnetic layer $25_1$ may be simply referred to as the NiFe layer $25_1$, and the CoFe ferromagnetic layers $25_2$ to $25_4$ may be simply referred to as the CoFe layers $25_2$ to $25_4$. The free magnetic layer 24 shown in FIG. 10 exhibits relatively weak antiferromagnetic coupling between the NiFe layer $25_1$ and the CoFe layer $25_2$, and relatively strong antiferromagnetic couplings between the CoFe layers $25_2$ and $25_3$ and between the CoFe layers $25_3$ and $25_4$. Accordingly, as is the case of the free magnetic layer 14 shown in FIG. 6, the structure shown in FIG. 10 effectively increases the saturation magnetic field of the free magnetic layer 24 with the spin-flop field thereof reduced.

In an alternative embodiment, the ferromagnetic layer $25_1$ may be replaced with a NiCoFe ferromagnetic layer having a relatively decreased Co concentration, and the ferromagnetic layers $25_2$ to $25_4$ may be replaced with NiCoFe ferromagnetic layers having a relatively increased Co concentration. Those skilled in the art would appreciate that such structure causes the same effect.

Figure 11:
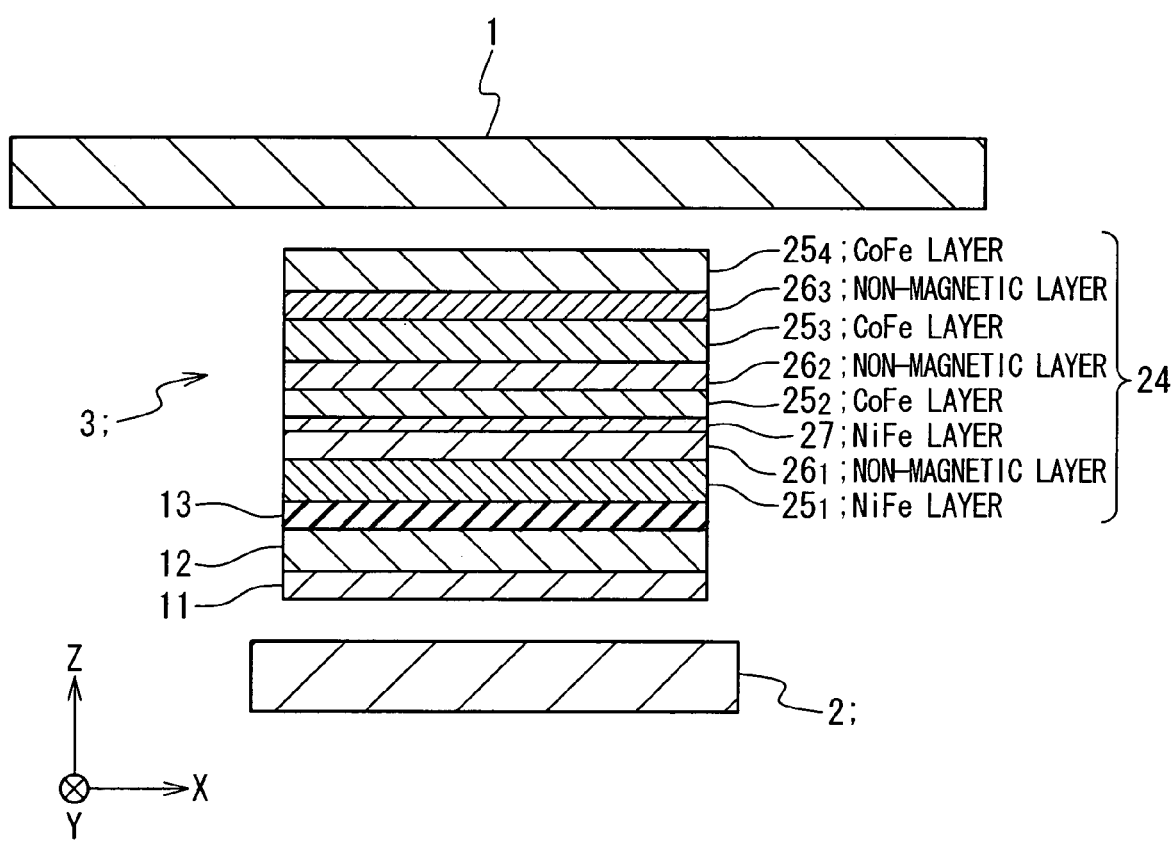

In an alternative embodiment, a NiFe layer 27 may be disposed between the CoFe layer $25_2$ and the non-magnetic layer $26_1$, as shown in FIG. 11. Disposing the NiFe layer 27 effectively reduces the strength of the antiferromagnetic coupling between the NiFe layer $25_1$ and the CoFe layer $25_2$, since the strength of exchange interaction through a non-magnetic layer depends on the materials of ferromagnetic layers sandwiching the non-magnetic layer.

Figure 12:
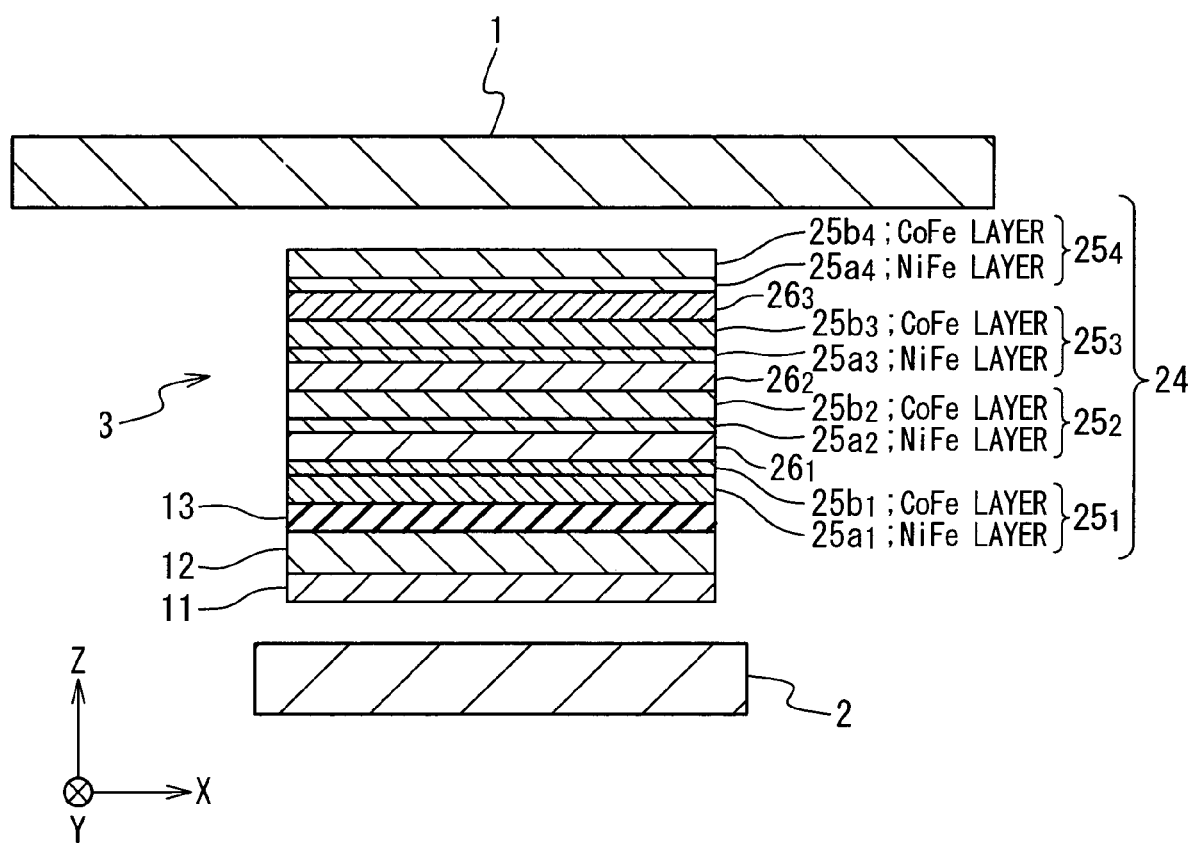

Referring to FIG. 12, the ferromagnetic layers $25_1$ to $25_4$ may be each composed of a two-layer structure of a NiFe layer and a CoFe layer. In this case, the Co concentrations of the ferromagnetic layers $25_1$ to $25_4$ may be each controlled on the ratio of the thicknesses of the NiFe layer and the CoFe layer. Specifically, the free ferromagnetic layer 24 shown in FIG. 12 incorporates a NiFe layer $25a_1$ and a CoFe layer $25b_1$ within the ferromagnetic layer $25_1$, and a NiFe layer $25a_2$ and a CoFe layer $25b_2$ within the ferromagnetic layer $25_2$. Correspondingly, the ferromagnetic layer $25_3$ is composed of a NiFe layer $25a_3$ and a CoFe layer $25b_3$, and the ferromagnetic layer $25_4$ is composed of a NiFe layer $25a_4$ and a CoFe layer $25b_4$. The ferromagnetic layer $25_1$ is relatively reduced in the thickness of the CoFe layer $25b_1$, and the ferromagnetic layers $25_2$ to $25_4$ are increased in the thicknesses of the CoFe layers $25b_2$ to $25b_4$. Such structure relatively weakens the antiferromagnetic coupling between the ferromagnetic layers $25_1$ and $25_2$, while enhancing the antiferromagnetic couplings between the ferromagnetic layers $25_2$ and $25_3$ and between the ferromagnetic layers $25_3$ and $25_4$. Accordingly, as is the case of the free magnetic layer 14 shown in FIG. 6, the structure shown in FIG. 12 effectively increases the saturation magnetic field of the free magnetic layer 24 with the spin-flop field thereof reduced.

The strengths of the antiferromagnetic couplings between the adjacent ferromagnetic layers may be controlled on the crystallinities of the ferromagnetic layers. The exchange interaction is enhanced as the crystallinities of the ferromagnetic layers are improved, and vice versa. The crystallinities of the ferromagnetic layers may be controlled through subjecting the ferromagnetic layers to various kinds of special processes. For example, subjecting a ferromagnetic layer to inert gas plasma, such as Ar gas plasma, deteriorates the crystallinity of the ferromagnetic layer, and thereby weakens the exchange interaction relevant to the ferromagnetic layer. Correspondingly, subjecting a ferromagnetic layer to a surfactant process introducing a minute quantity of oxygen through depositing the ferromagnetic layer in an oxygen-including atmosphere also deteriorates the crystallinity of the ferromagnetic layer, and thereby weakens the exchange interaction. The oxygen FIG. 13A illustrates an exemplary structure of the free magnetic layer 24 in which the strengths of the antiferromagnetic couplings are optimized on the crystallinities of the respective ferromagnetic layers. Specifically, the free magnetic layer 24 shown in FIG. 13A is composed of a plasma-treated layer $25_1'$, which is subjected to inert gas plasma after the deposition, ferromagnetic layers $25_2$ to $25_4$, which are not subjected to inert gas plasma, and non-magnetic layers $26_1$ to $26_3$. Such structure weakens the antiferromagnetic coupling between the plasma-treated layer $25_1'$ and the ferromagnetic layer $25_2$, providing relatively strong antiferromagnetic couplings between the ferromagnetic layers $25_2$ and $25_3$ and between the ferromagnetic layers $25_3$ and $25_4$. Accordingly, as is the case of the free magnetic layer 14 shown in FIG. 6, the structure shown in FIG. 13A effectively increases the saturation magnetic field of the free magnetic layer 24 with the spin-flop field thereof reduced.

Figure 13B:
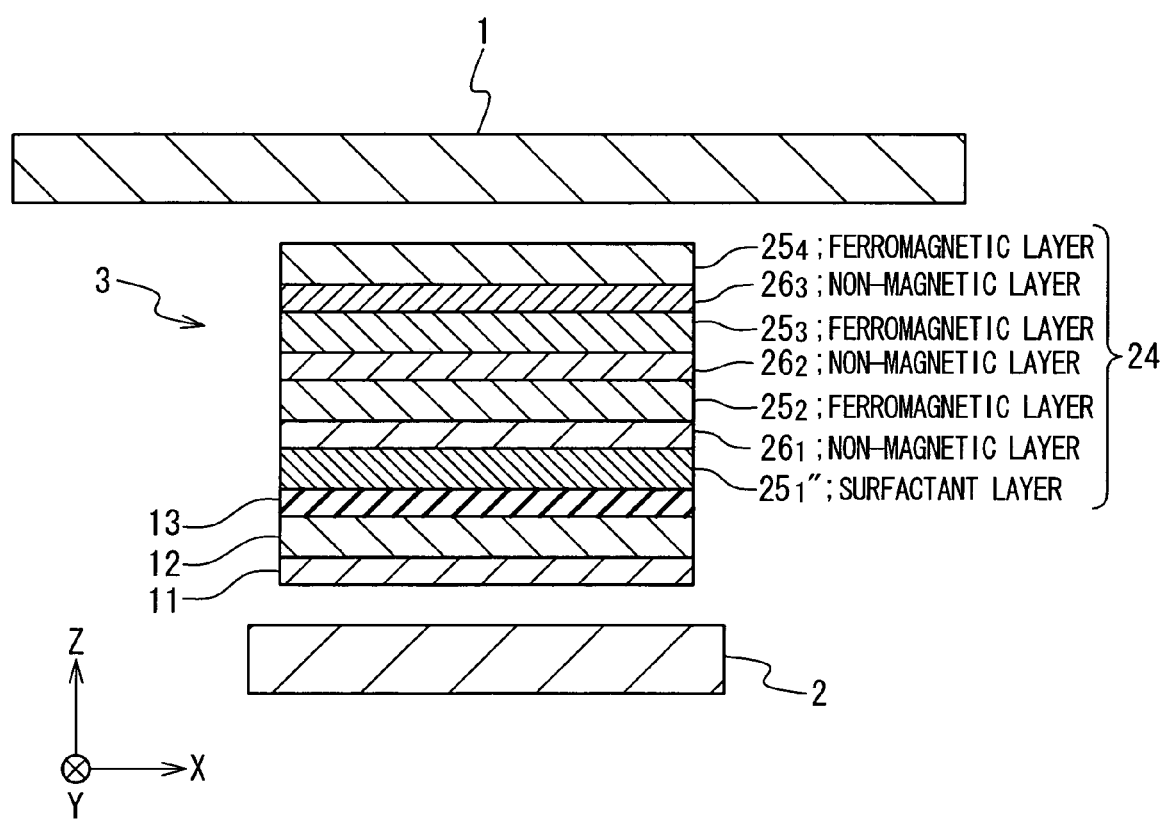

The crystallinities of the ferromagnetic layers may be controlled by applying a surfactant process to the ferromagnetic layer instead of the inert gas plasma process. Specifically, as shown in FIG. 13B, the surfactant layer $25_1''$, which is a ferromagnetic layer into which a minute quantity of oxygen is introduced during the deposition, may be used instead of the plasma-treated layer $25_1'$. This structure also increases the saturation magnetic field of the free magnetic layer 24 with the spin-flop field thereof reduced.

The strengths of the antiferromagnetic couplings between the adjacent ferromagnetic layers may be controlled on the material of the intermediate non-magnetic layers. A non-magnetic layer of ruthenium causes relatively strong exchange interaction, while a non-magnetic layer formed of material other than ruthenium, such as iridium, causes relatively weak exchange interaction.

Figure 14:
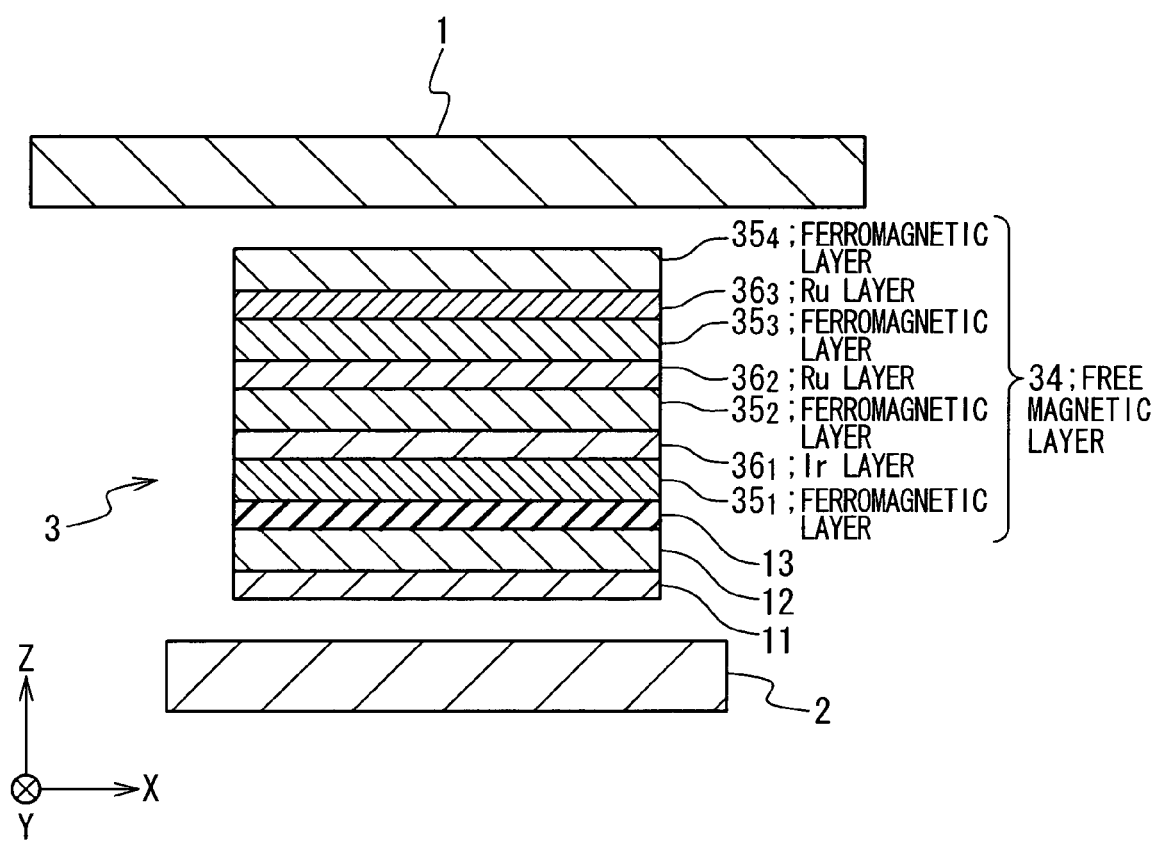

FIG. 14 illustrates an exemplary structure of a free magnetic layer 34 in which the strengths of the antiferromagnetic couplings between the adjacent ferromagnetic layers are controlled on the material of the intermediate non-magnetic layers. The free magnetic layer 34 is composed of ferromagnetic layers $35_1$ to $35_4$, an Ir layer $36_1$ disposed between the ferromagnetic layers $35_1$ and $35_2$, and Ru layers $36_2$ and $36_3$ separating the ferromagnetic layers $35_2$ to $35_4$. The structure shown in FIG. 14 provide relatively weak antiferromagnetic coupling between the ferromagnetic layers $35_1$ and $35_2$, while providing relatively strong antiferromagnetic couplings between the ferromagnetic layers $35_2$ and $35_3$ and between the ferromagnetic layers $35_3$ and $35_4$. Accordingly, as is the case of the free magnetic layer 14 shown in FIG. 6, the structure shown in FIG. 14 effectively increases the saturation magnetic field of the free magnetic layer 24 with the spin-flop field thereof reduced.

The strengths of the antiferromagnetic couplings between the adjacent ferromagnetic layers may be controlled on the thicknesses of the respective ferromagnetic layers. A thick ferromagnetic layer provides strong magnetostatic coupling, and thereby enhances the antiferromagnetic coupling with an adjacent ferromagnetic layer. A thin ferromagnetic layer, on the contrary, provides weak antiferromagnetic coupling with an adjacent ferromagnetic layer.

Figure 15:
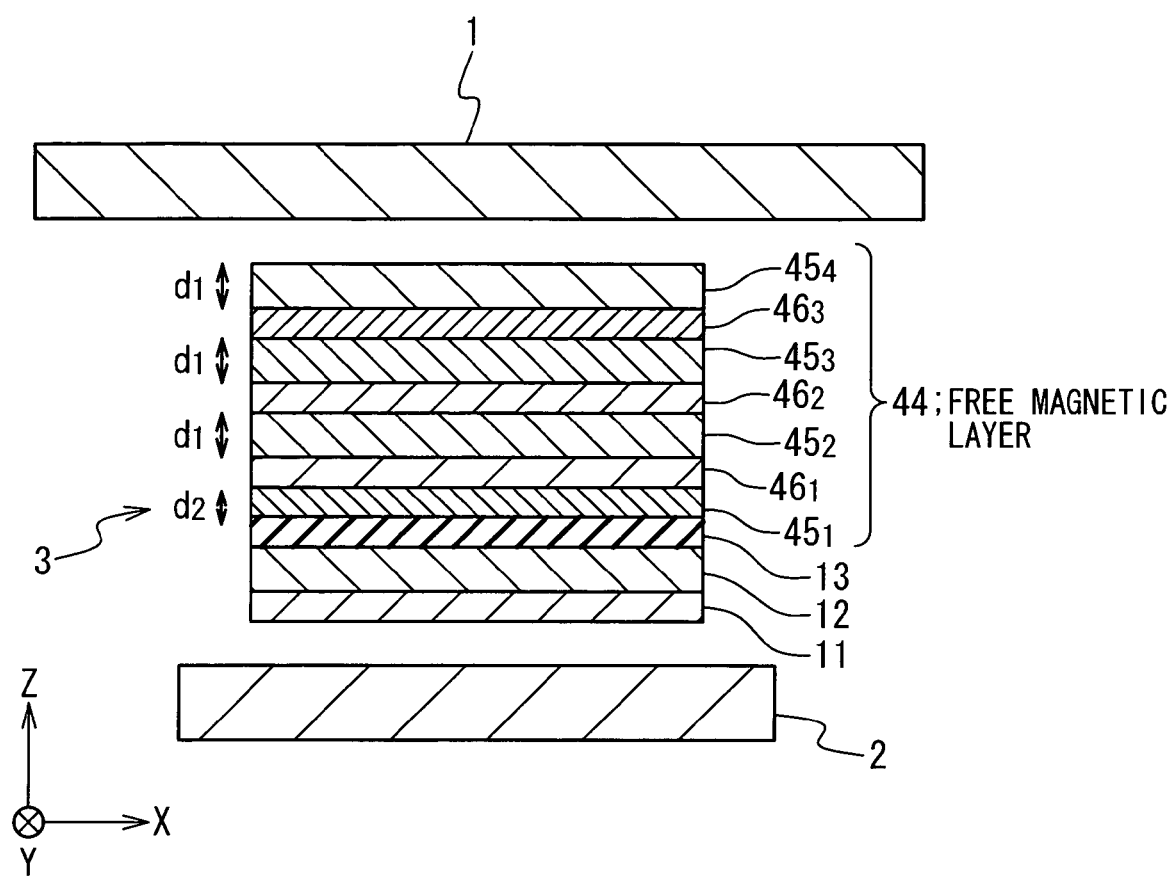

FIG. 15 illustrates an exemplary structure of a free magnetic layer 44 in which strengths of antiferromagnetic couplings are controlled on the thicknesses of the respective ferromagnetic layers. The free magnetic layer 44 is composed of ferromagnetic layers $45_1$ to $45_4$, and non-magnetic layers $46_1$ to $46_3$. The ferromagnetic layer $45_1$ has a relatively thin thickness of $d_2$, while the remaining ferromagnetic layers $45_2$ to $45_4$ have a relatively thick thickness of $d_1$. This structure provides relatively weak antiferromagnetic coupling between the ferromagnetic layers $45_1$ and $45_2$, while providing relatively strong antiferromagnetic couplings between the ferromagnetic layers $45_2$ and $45_3$ and between the ferromagnetic layers $45_3$ and $45_4$. Accordingly, as is the case of the free magnetic layer 14 shown in FIG. 6, the structure shown in FIG. 14 effectively increases the saturation magnetic field of the free magnetic layer 44 with the spin-flop field thereof reduced.

It should be understood that the number of the ferromagnetic layers within the free magnetic layer is not limited to four; the number of the ferromagnetic layers within the free magnetic layer is allowed to be three or more. In one embodiment, a free magnetic layer may be composed of three ferromagnetic layers separated by two non-magnetic layers, so that the antiferromagnetic coupling between end and intermediate ones of the ferromagnetic layers is stronger than the antiferromagnetic coupling between another end one and the intermediate one. In another embodiment, a free magnetic layer may be composed of five ferromagnetic layers separated by four intermediate non-magnetic layers, so that the antiferromagnetic coupling between an end pair of the ferromagnetic layers is relatively weak, and the antiferromagnetic couplings between remaining pairs of the ferromagnetic layers are relatively strong. Such structure effectively increases the saturation magnetic field of the free magnetic layer 44 with the spin-flop field thereof reduced.

It should be also noted that different ones of the above described approaches may be used for controlling the strengths of the antiferromagnetic couplings within the free magnetic layer.

Second Embodiment

As described above with reference to FIG. 9B, the magnetic memory presented in the first embodiment may suffer from the fact that he ferromagnetic layers $15_1$ to $15_4$ do not function as a synthetic antiferromagnet due to the independent behavior of the ferromagnetic layer $15_1$ from the remaining ferromagnetic layers $15_2$ to $15_4$, when the strength of the antiferromagnetic coupling between the ferromagnetic layer $15_1$ and $15_2$ is largely different from those between the ferromagnetic layer $15_2$ and $15_3$ and between the ferromagnetic layer $15_3$ and $15_4$. This undesirably inhibits the magnetic memory from achieving successful toggle writing.

In order to avoid such problem, the free magnetic layer is desirably designed so that the intermediate pair(s) of the ferromagnetic layers exhibit relatively strong antiferromagnetic coupling compared to the both end pairs of the ferromagnetic layers.

Figure 16:
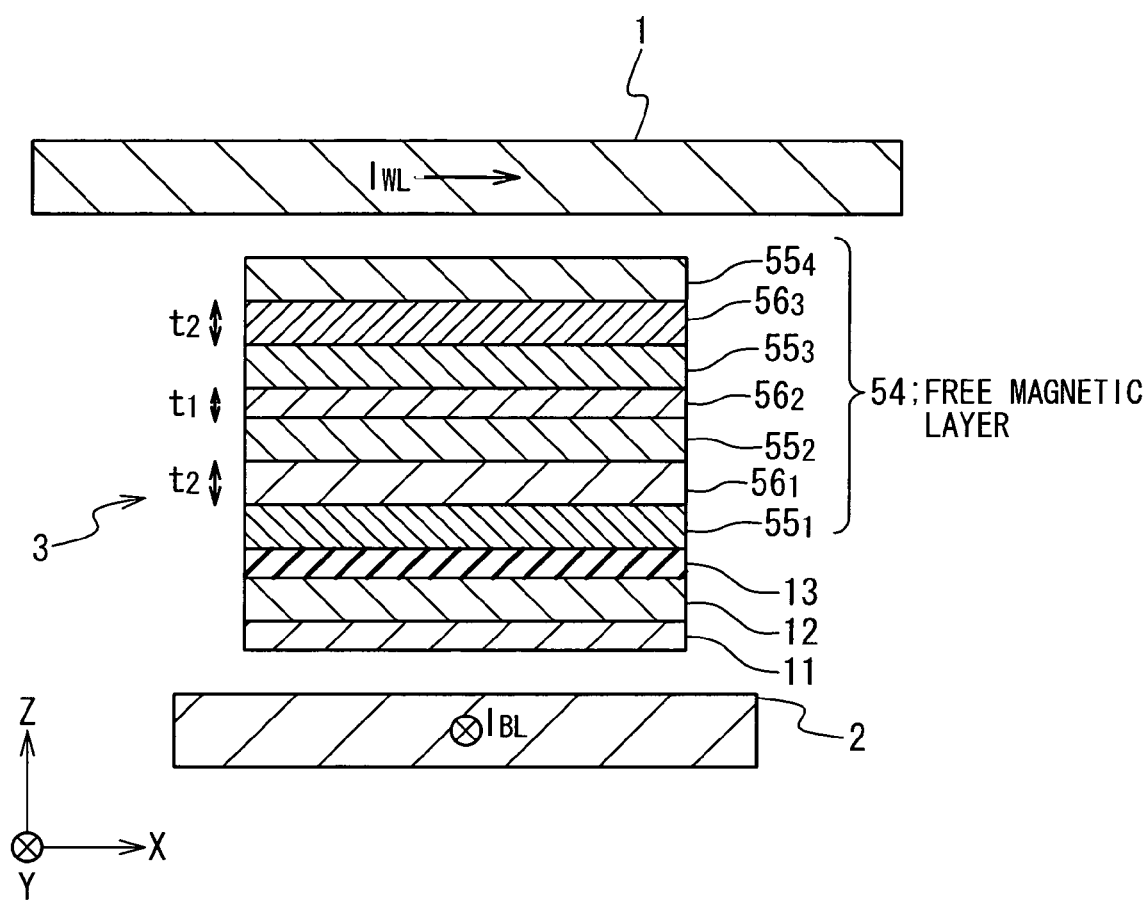
FIG. 16 is a section view illustrating an exemplary structure of a magnetic memory in a second embodiment.

FIG. 16 is a section view illustrating an exemplary structure of such designed magnetic memory. A free magnetic layer 54 within the magnetic memory shown in FIG. 16 is composed of ferromagnetic layers $55_1$ to $55_4$ separated by non-magnetic layers $56_1$ to $56_3$. The non-magnetic layer $56_2$ has a thickness associated with the first antiferromagnetic peak of the coupling coefficient of the exchange interaction, and the non-magnetic layers $56_1$ and $56_3$ have a thickness associated with the second antiferromagnetic peak. It should be noted that the thickness $t_2$ is thinner than the thickness $t_1$, as shown in FIG. 7. The structure of the free magnetic layer 54 enhances the antiferromagnetic coupling between the intermediate pair of the ferromagnetic layers $55_2$ and $55_3$, compared to those between an end pair of the ferromagnetic layers $55_1$ and $55_2$ and between another end pair of the ferromagnetic layers $55_3$ and $55_4$.

Figure 17:
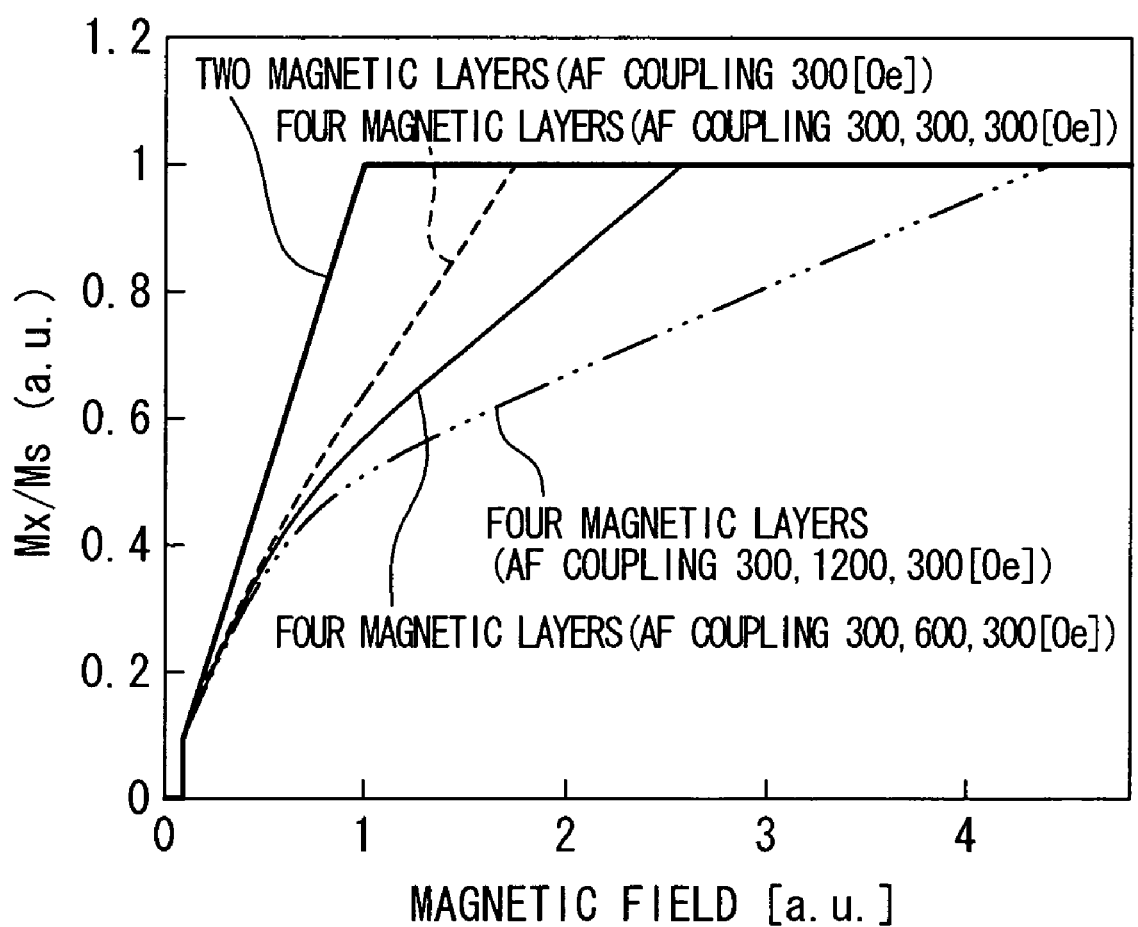
FIG. 17 is a graph illustrating an effect of optimization of strengths of antiferromagnetic couplings on the magnetization curve of the free magnetic layer.

The thus-described structure of the free magnetic layer 54 promotes the ferromagnetic layers $55_1$ to $55_4$ to operate a single synthetic antiferromagnet. FIG. 17 is a graph of magnetization curves of the free magnetic layer 54, proving that the free magnetic layer 54 operates as a single synthetic antiferromagnet, the graph being obtained by Landau-Lifshitz simulation. It should be noted that the resultant magnetization Mx of the free magnetic layer 54 is normalized by the saturated magnetization Ms thereof in FIG. 17. The risings of the magnetization curves indicate the spin-flop field of the free magnetic layer 54, and the magnetic field at which Mx/Ms equals one indicates the saturation magnetic field of the free magnetic layer 54.

The legend "FOUR MAGNETIC LAYERS (AF COUPLING 300, 300, 300 [Oe])" indicates the magnetization curve of the free magnetic layer 54 in which the strengths of the antiferromagnetic couplings between the ferromagnetic layers $55_1$ and $55_2$, between the ferromagnetic layers $55_2$ and $55_3$, and between the ferromagnetic layers $55_3$ and $55_4$ are each equivalent to a coupling magnetic field of 300 [Oe]. Correspondingly, the legend "FOUR MAGNETIC LAYERS (AF COUPLING 300, 600, 300 [Oe])" indicates the magnetization curve of the free magnetic layer 14 in which the strength of the antiferromagnetic coupling between the ferromagnetic layers $55_2$ and $55_3$ is equivalent to a coupling magnetic field of 600 [Oe], and the strengths of the antiferromagnetic couplings between the ferromagnetic layers $55_1$ and $55_2$ and between the ferromagnetic layers $55_3$ and $55_4$ are equivalent to a coupling magnetic field of 300 [Oe]. Furthermore, the legend "FOUR MAGNETIC LAYERS (AF COUPLING 300, 1200, 300 [Oe])" indicates the magnetization curve of the free magnetic layer 54 in which the strengths of the antiferromagnetic couplings between the ferromagnetic layers $55_1$ and $55_2$ and between the ferromagnetic layers $55_3$ and $55_4$ are equivalent to a coupling magnetic field of 300 [Oe], and the strength of the antiferromagnetic coupling between the ferromagnetic layers $55_2$ and $55_3$ is equivalent to a coupling magnetic field of 1200 [Oe]. It should be noted that the strength of the antiferromagnetic coupling between ferromagnetic layers $55_1$ and $55_2$ is fixedly 300 [Oe] for all the magnetization curves. Finally, the legend "TWO MAGNETIC LAYERS (AF COUPLING 300 [Oe])" indicates a magnetization curve of a comparative synthetic antiferromagnet consists of a pair of ferromagnetic layers coupled by antiferromagnetic coupling of a strength corresponding to a coupling magnetic field of 300 [Oe], the comparative synthetic antiferromagnet being associated with a tri-layer structure composed of ferromagnetic layers $55_1$ and $55_2$ separated by a non-magnetic layer $56_1$.

As shown in FIG. 14, enhancing the antiferromagnetic coupling between the intermediate ferromagnetic layers $55_2$ and $55_3$ effectively increases the saturation magnetic field of the free magnetic layer 54. Additionally, the relatively weak antiferromagnetic couplings effectively reduce the spin-flop field of the free magnetic layer 54.

Additionally, providing relatively weak antiferromagnetic couplings between the both end pairs of the ferromagnetic layers, that is, between the ferromagnetic layers $55_1$ and $55_2$ and between the ferromagnetic layers $55_3$ and $55_4$ effectively promotes the ferromagnetic layers $55_1$ to $55_4$ to operate as a single synthetic antiferromagnet; this is concluded from the fact that the associated magnetization curves of the free magnetic layer 54 exhibit no inflexion point, with the curves constantly kept convex upward. The fact that the ferromagnetic layers $55_1$ to $55_4$ operate as a single synthetic antiferromagnet is effective for stabilizing toggle write operation.

As described above, the structure of the free magnetic layer 54 shown in FIG. 17 effectively achieves the stabilization of the toggle write operation in addition to the enlargement of the operation range of the magnetic memory.

As is the case of the first embodiment, the strengths of the antiferromagnetic couplings between the adjacent ferromagnetic layers may be controlled through various approaches other than the optimization of the thicknesses of the non-magnetic layers $56_1$ to $56_3$. For example, the strengths of the antiferromagnetic couplings may be controlled on the material of the ferromagnetic layers.

Figure 18:
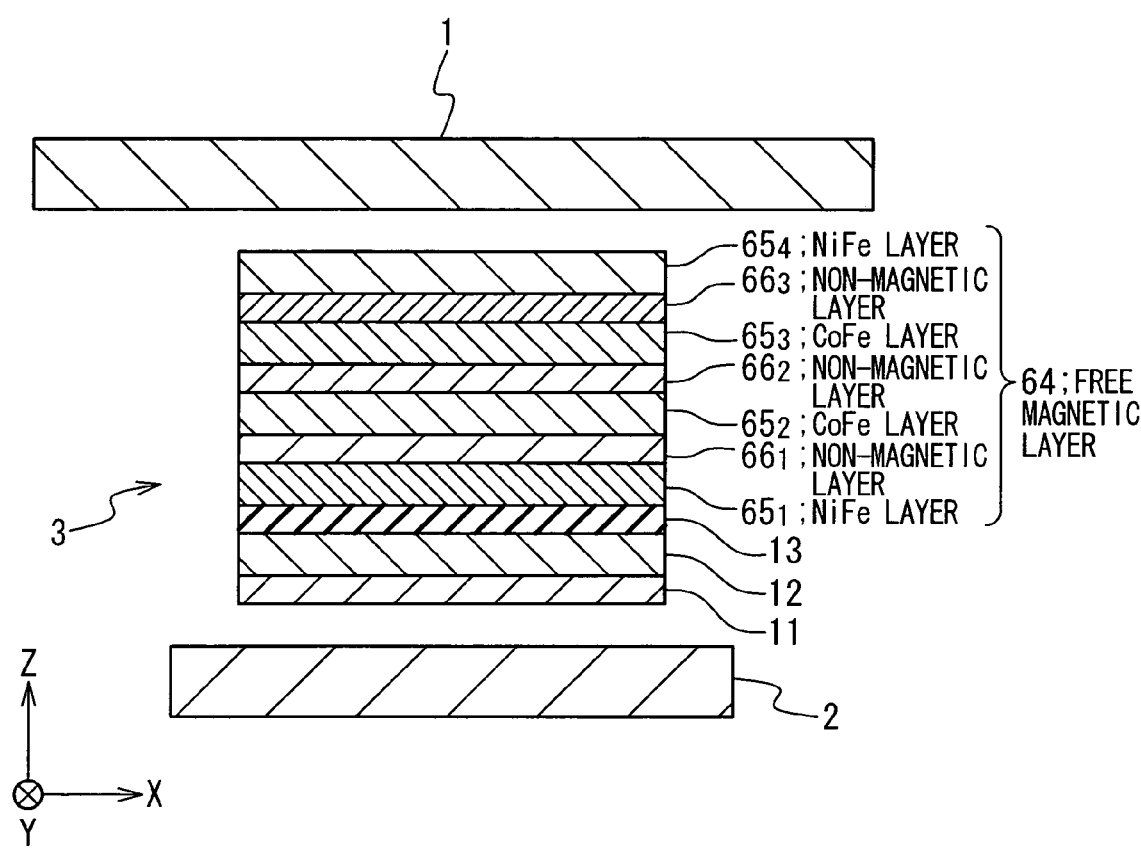
FIGS. 18 to 20, 21A, 21B, 22 and 23 are section views illustrating other exemplary structures.
Figure 19:
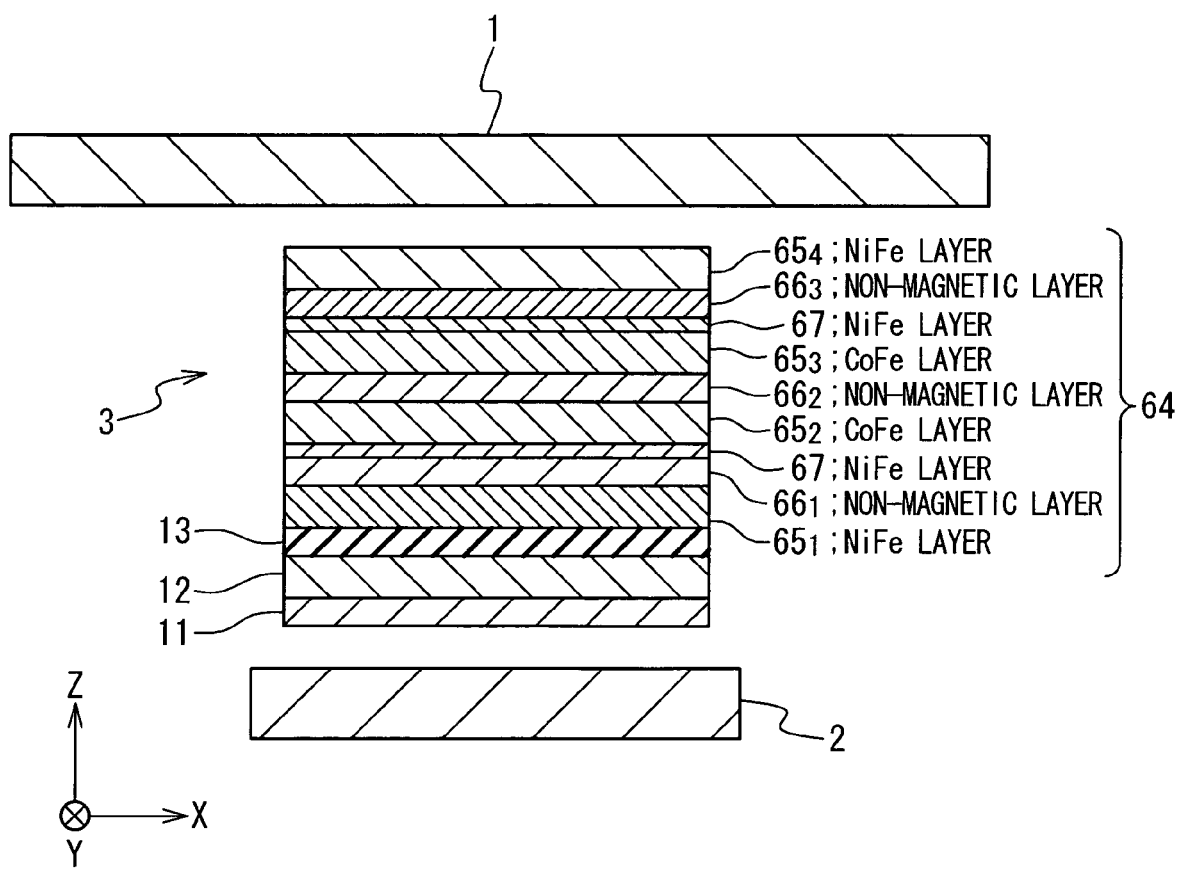

FIG. 18 illustrates an exemplary structure of a free magnetic layer 54 in which the strengths of the antiferromagnetic couplings are controlled on the material of the ferromagnetic layers. The free magnetic layer 64 is composed of a NiFe ferromagnetic layer $65_1$, CoFe ferromagnetic layers $65_2$ and $65_3$, and a NiFe ferromagnetic layer $65_4$, which are separated by Ru non-magnetic layers $66_1$ to $66_3$; in the following, the NiFe ferromagnetic layers $65_1$ and $65_4$ may be simply referred to as the NiFe layers $65_1$ and $65_4$, respectively, and the CoFe ferromagnetic layers $65_2$ and $65_3$ may be simply referred to as the CoFe layers $65_2$ and $65_4$. The free magnetic layer 64 shown in FIG. 18 exhibits relatively weak antiferromagnetic couplings between the NiFe layer $65_1$ and the CoFe layer $65_2$ and between the CoFe layer $65_3$ and the NiFe layer $65_4$, and relatively strong antiferromagnetic coupling between the CoFe layers $65_2$ and $65_3$. Accordingly, as is the case of the free magnetic layer 54 shown in FIG. 16, the structure shown in FIG. 18 effectively increases the saturation magnetic field of the free magnetic layer 64 with the spin-flop field thereof reduced.

In an alternative embodiment, the ferromagnetic layers $65_1$ and $65_4$ may be replaced with NiCoFe ferromagnetic layers having a relatively decreased Co concentration, and the ferromagnetic layers $65_2$ and $65_3$ may be replaced with NiCoFe ferromagnetic layers having a relatively increased Co concentration. Those skilled in the art would appreciate that such structure causes the same effect.

In another alternative embodiment, NiFe layers 67 may be disposed between the CoFe layer $65_2$ and the non-magnetic layer $66_1$, and between the CoFe layer $65_3$ and the non-magnetic layer $66_3$. Disposing the NiFe layers 67 effectively reduces the strengths of the antiferromagnetic couplings between the NiFe layer $65_1$ and the CoFe layer $65_2$, and between the CoFe layer $65_3$ and the NiFe layer $65_4$, since the strength of exchange interaction through a non-magnetic layer depends on the materials of ferromagnetic layers sandwiching the non-magnetic layer.

Figure 20:
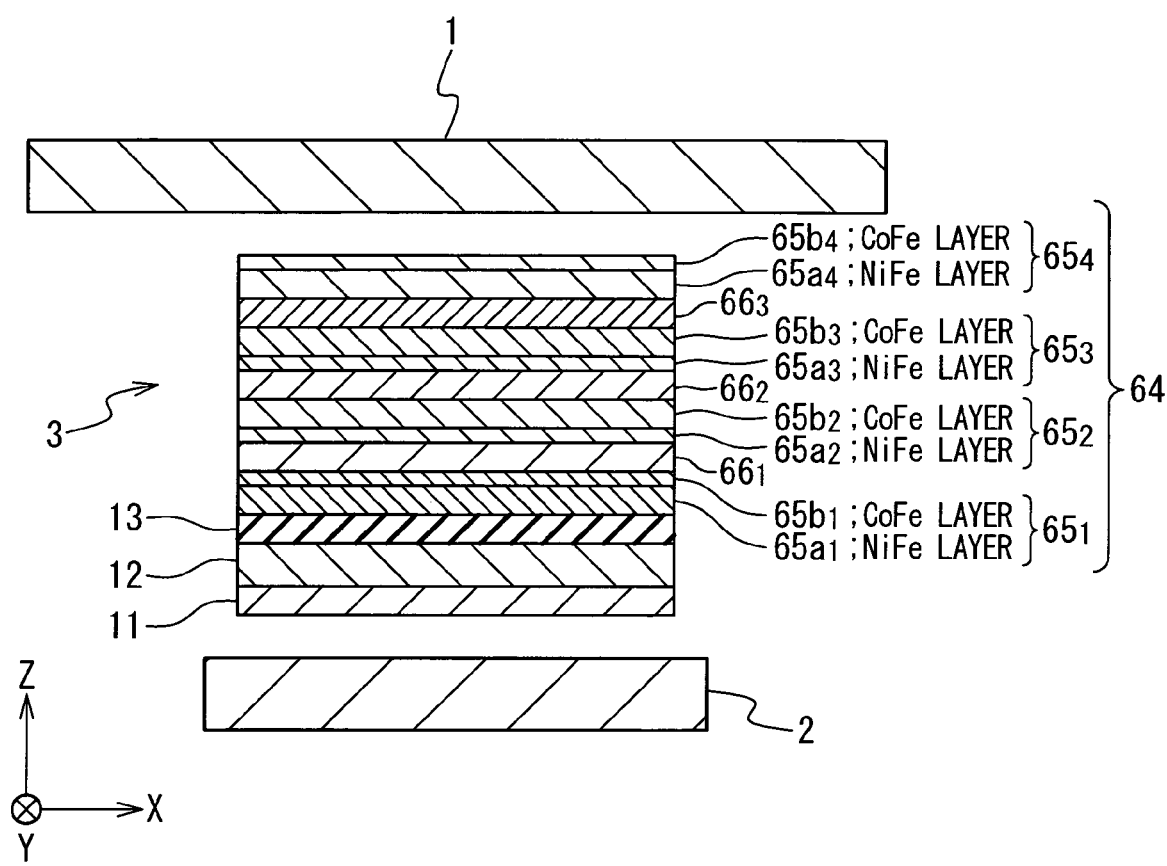

Referring to FIG. 20, the ferromagnetic layers $65_1$ to $65_4$ may be each composed of a two-layer structure of a NiFe layer and a CoFe layer. In this case, the Co concentrations of the ferromagnetic layers $65_1$ to $65_4$ may be each controlled on the ratio of the thicknesses of the NiFe layer and the CoFe layer. Specifically, the free ferromagnetic layer 64 shown in FIG. 20 incorporates a NiFe layer $65a_1$ and a CoFe layer $65b_1$ within the ferromagnetic layer $65_1$, and a NiFe layer $65a_2$ and a CoFe layer $65b_2$ within the ferromagnetic layer $65_2$. Correspondingly, the ferromagnetic layer $65_3$ is composed of a NiFe layer $65a_3$ and a CoFe layer $65b_3$, and the ferromagnetic layer $65_4$ is composed of a NiFe layer $65a_4$ and a CoFe layer $65b_4$. The ferromagnetic layer $65_1$ is relatively reduced in the thickness of the CoFe layer $65b_1$, and the ferromagnetic layers $65_2$ to $25_4$ are increased in the thicknesses of the CoFe layers $65b_2$ to $65b_4$. Such structure relatively weakens the antiferromagnetic couplings between the ferromagnetic layers $65_1$ and $65_2$ and between the ferromagnetic layers $65_3$ and $65_4$, while enhancing the antiferromagnetic couplings between the ferromagnetic layers $65_2$ and $65_3$. Accordingly, as is the case of the free magnetic layer 54 shown in FIG. 16, the structure shown in FIG. 20 effectively increases the saturation magnetic field of the free magnetic layer 64 with the spin-flop field thereof reduced, allowing the ferromagnetic layers $65_1$ to $65_4$ to function a single synthetic antiferromagnet.

The strengths of the antiferromagnetic couplings between the adjacent ferromagnetic layers may be controlled on the crystallinities of the ferromagnetic layers. As described above, subjecting the ferromagnetic layer to inert gas plasma, such as Ar gas plasma deteriorates the crystallinity of a ferromagnetic layer, and thereby weakens the exchange interaction relevant thereto. Correspondingly, subjecting a ferromagnetic layer to a surfactant process introducing a minute quantity of oxygen into the ferromagnetic layer also deteriorates the crystallinity of the ferromagnetic layer, and thereby weakens the exchange interaction.

Figure 21A:
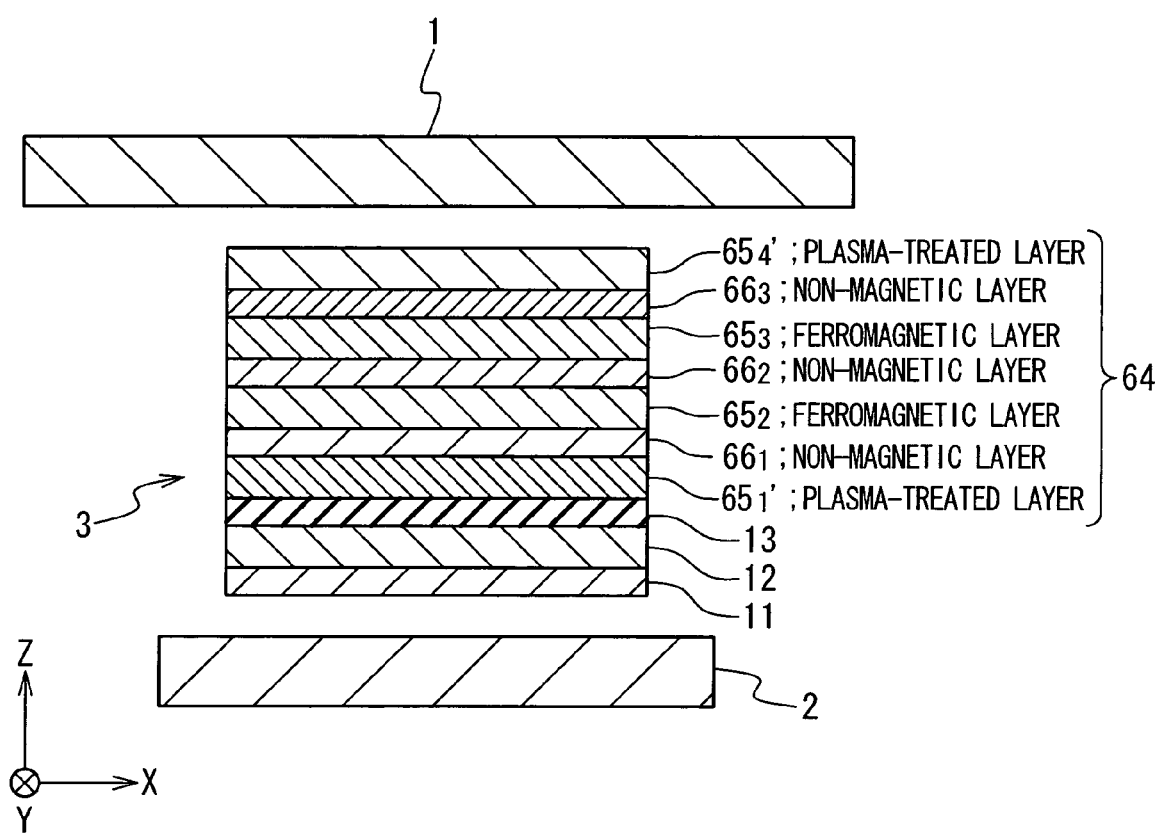

FIG. 21A illustrates an exemplary structure of the free magnetic layer 64 in which the strengths of the antiferromagnetic couplings are optimized on the crystallinities of the respective ferromagnetic layers. Specifically, the free magnetic layer 64 shown in FIG. 23A is composed of plasma-treated layers $65_1$' and $65_4$', which is subjected to inert gas plasma after the deposition, ferromagnetic layers $65_2$ and $65_4$, which are not subjected to inert gas plasma, and non-magnetic layers $66_1$ to $66_3$. Such structure weakens the antiferromagnetic couplings between the plasma-treated layer $65_1$' and the ferromagnetic layer $65_2$ and between the ferromagnetic layer $65_3$ and the plasma-treated layer $65_4$', providing relatively strong antiferromagnetic coupling between the ferromagnetic layers $65_2$ and $65_3$. Accordingly, as is the case of the free magnetic layer 64 shown in FIG. 16, the structure shown in FIG. 21A effectively increases the saturation magnetic field of the free magnetic layer 64 with the spin-flop field thereof reduced, allowing the ferromagnetic layers $65_1$ to $65_4$ to function a single synthetic antiferromagnet.

Figure 21B:
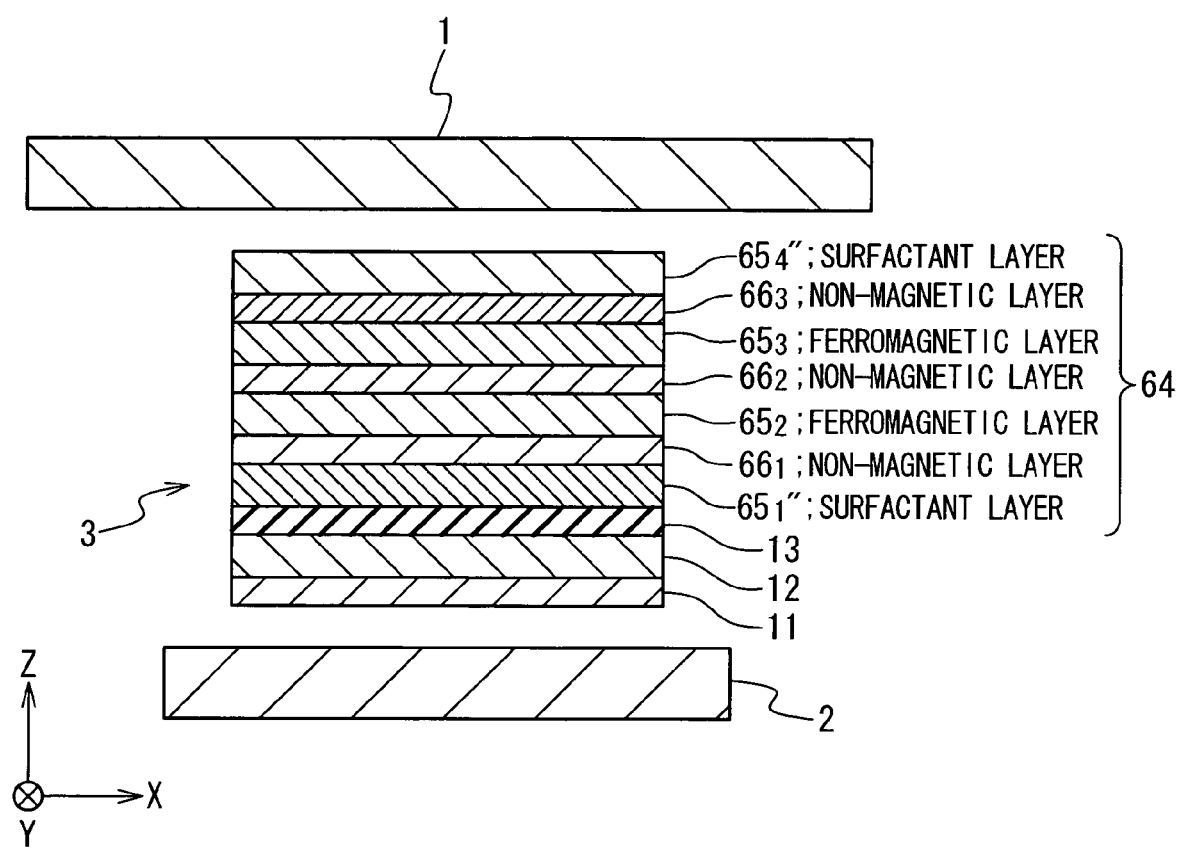

The crystallinities of the ferromagnetic layers may be controlled by applying a surfactant process to the ferromagnetic layers instead of the inert gas plasma process. Specifically, as shown in FIG. 21B, the surfactant layers $65_1$" and $65_4$", which are ferromagnetic layers into which a minute quantity of oxygen is introduced during the deposition, may be used instead of the plasma-treated layers $65_1$' and $65_4$'. This structure also increases the saturation magnetic field of the free magnetic layer 64 with the spin-flop field thereof reduced, allowing the ferromagnetic layers $65_1$ to $65_4$ to function a single synthetic antiferromagnet.

The strengths of the antiferromagnetic couplings between the adjacent ferromagnetic layers may be controlled on the material of the intermediate non-magnetic layers.

Figure 22:
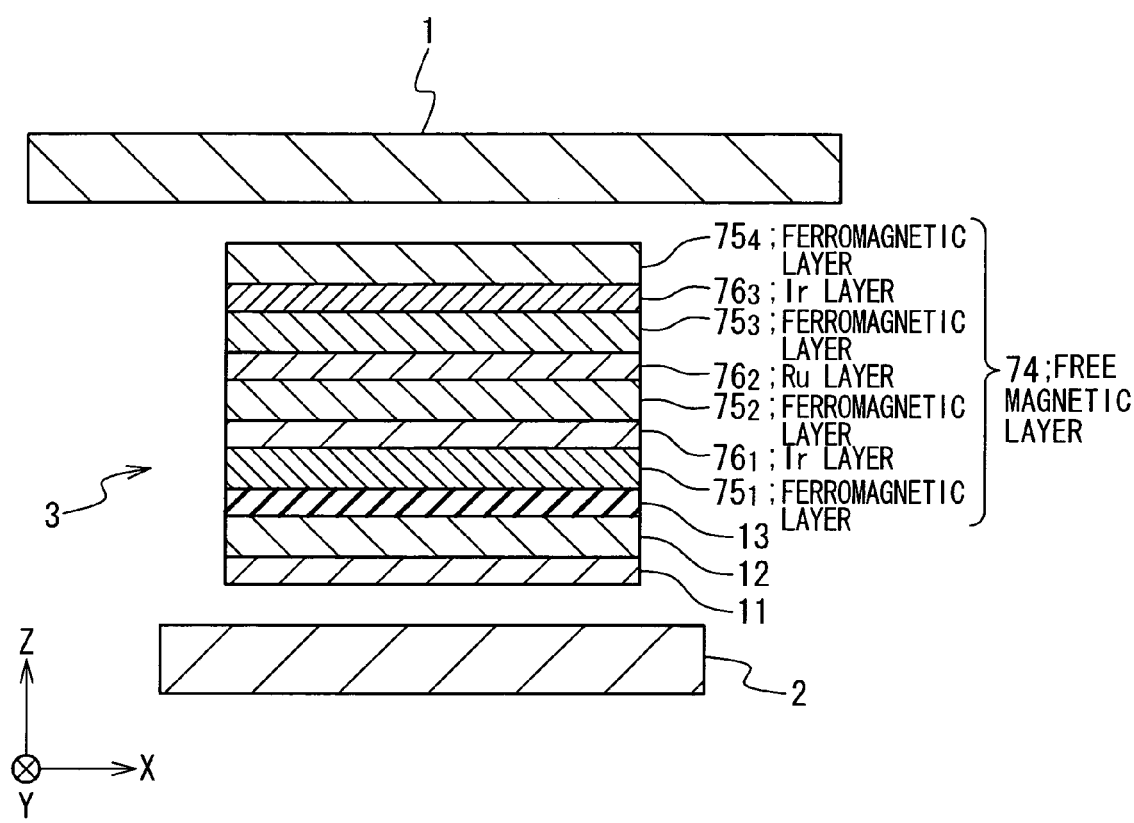

FIG. 22 illustrates an exemplary structure of a free magnetic layer 74 in which the strengths of the antiferromagnetic couplings between the adjacent ferromagnetic layers are controlled on the material of the intermediate non-magnetic layers. The free magnetic layer 74 is composed of ferromagnetic layers $75_1$ to $75_4$, an Ir layer $76_1$ disposed between the ferromagnetic layers $75_1$ and $75_2$, a Ru layer $76_2$ and $76_3$ separating the ferromagnetic layers $75_2$ and $75_3$, and an Ir layer $76_3$ disposed between the ferromagnetic layers $75_3$ and $75_4$. The structure shown in FIG. 22 provide relatively weak antiferromagnetic couplings between the ferromagnetic layers $75_1$ and $75_2$ and between the ferromagnetic layers $75_3$ and $75_4$, while providing relatively strong antiferromagnetic coupling between the ferromagnetic layers $75_2$ and $75_3$. Accordingly, as is the case of the free magnetic layer 54 shown in FIG. 16, the structure shown in FIG. 22 effectively increases the saturation magnetic field of the free magnetic layer 74 with the spin-flop field thereof reduced, allowing the ferromagnetic layers $75_1$ to $75_4$ to function a single synthetic antiferromagnet.

Figure 23:
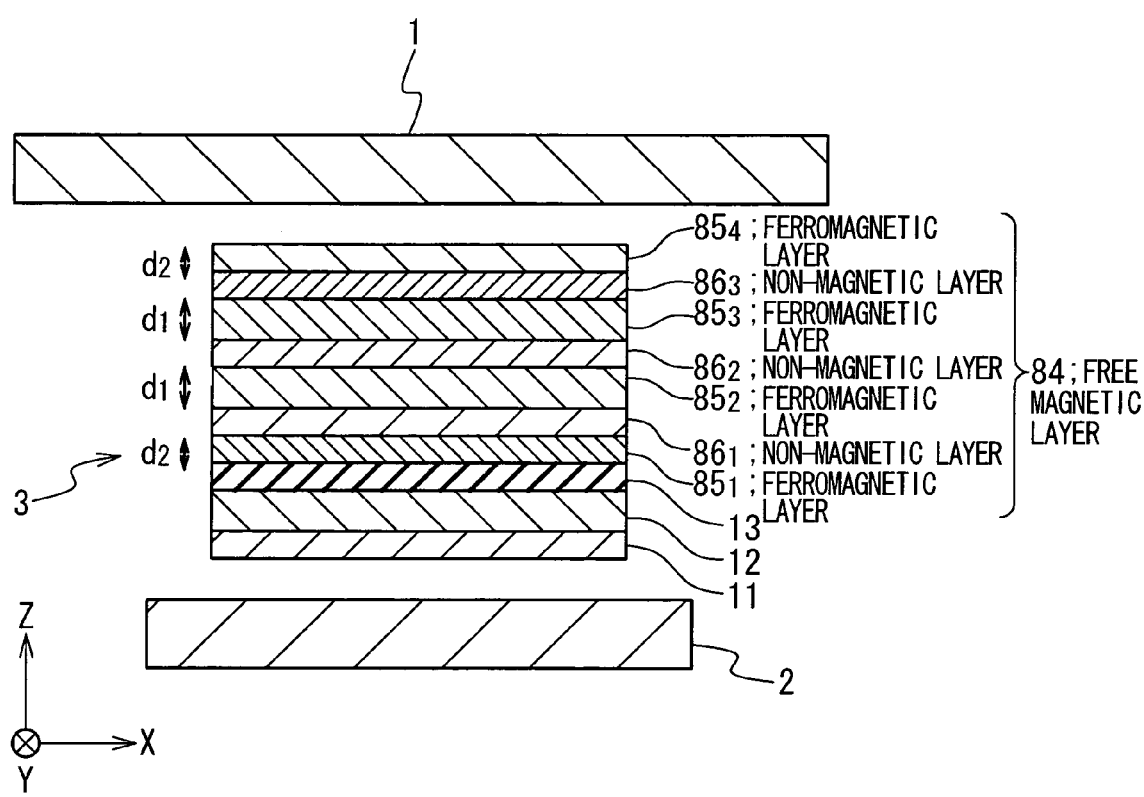

The strengths of the antiferromagnetic couplings between the adjacent ferromagnetic layers may be controlled on the thicknesses of the respective ferromagnetic layers. FIG. 23 illustrates an exemplary structure of a free magnetic layer 84 in which strengths of antiferromagnetic couplings are controlled on the thicknesses of the respective ferromagnetic layers. The free magnetic layer 84 is composed of ferromagnetic layers $85_1$ to $85_4$, and non-magnetic layers $86_1$ to $86_3$. The ferromagnetic layers $85_1$ and $85_4$ have a relatively thin thickness of $d_2$, while the remaining ferromagnetic layers $85_2$ and $85_3$ have a relatively thick thickness of $d_1$. This structure provides relatively weak antiferromagnetic couplings between the ferromagnetic layers $85_1$ and $85_2$ and between the ferromagnetic layers $85_3$ and $85_4$, while providing relatively strong antiferromagnetic couplings between the ferromagnetic layers $85_2$ and $85_3$.

Accordingly, as is the case of the free magnetic layer 64 shown in FIG. 16, the structure shown in FIG. 23 effectively increases the saturation magnetic field of the free magnetic layer 84 with the spin-flop field thereof reduced, allowing the ferromagnetic layers $85_1$ to $85_4$ to function a single synthetic antiferromagnet.

It should be understood that the number of the ferromagnetic layers within the free magnetic layer is not limited to four; the number of the ferromagnetic layers within the free magnetic layer is allowed to be more than four. In one embodiment, a free magnetic layer may be composed of five ferromagnetic layers separated by four intermediate non-magnetic layers, so that the antiferromagnetic couplings between both end pairs of the ferromagnetic layers are relatively weak, and the antiferromagnetic couplings between remaining pairs of the ferromagnetic layers are relatively strong. Such structure effectively increases the saturation magnetic field of the free magnetic layer with the spin-flop field thereof reduced, allowing the ferromagnetic layers to function a single synthetic antiferromagnet.

It should be also noted that different ones of the above described approaches may be used for controlling the strengths of the antiferromagnetic couplings within the free magnetic layer.

Experimental Result

Figure 24A:
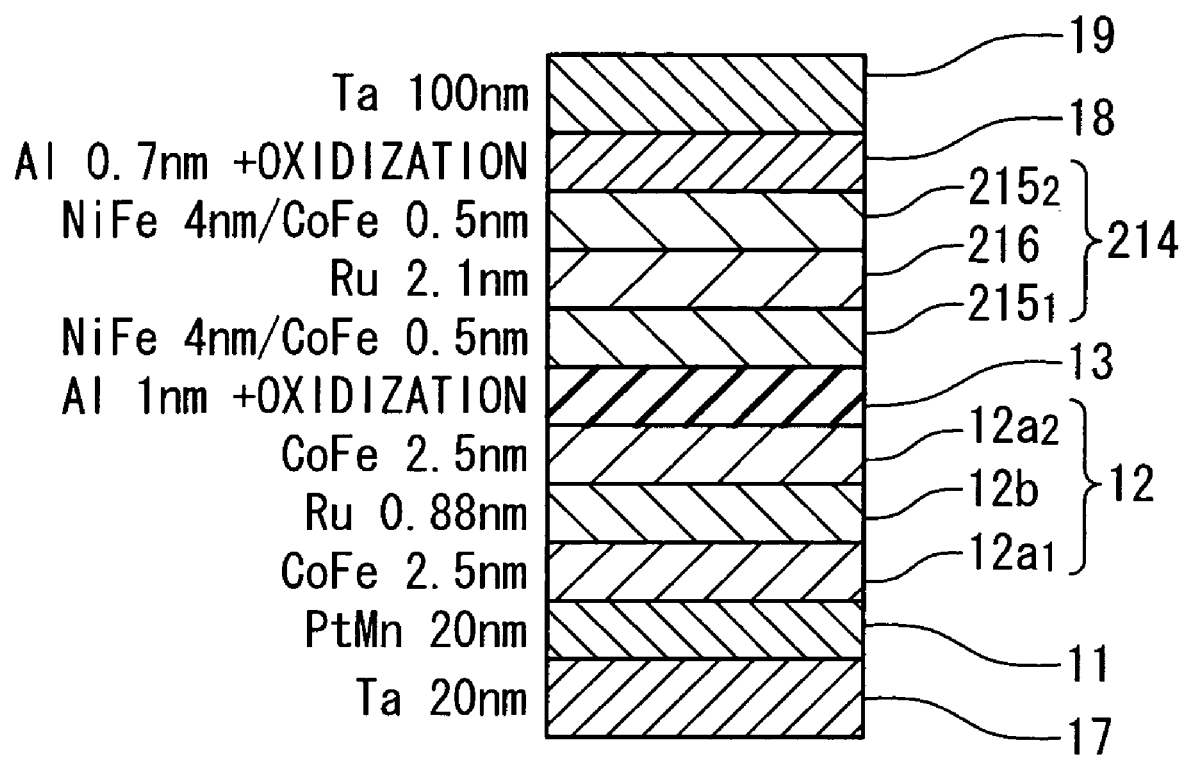
FIG. 24A is a section view illustrating a structure of a magnetoresistance element associated with a comparative example.
Figure 24B:
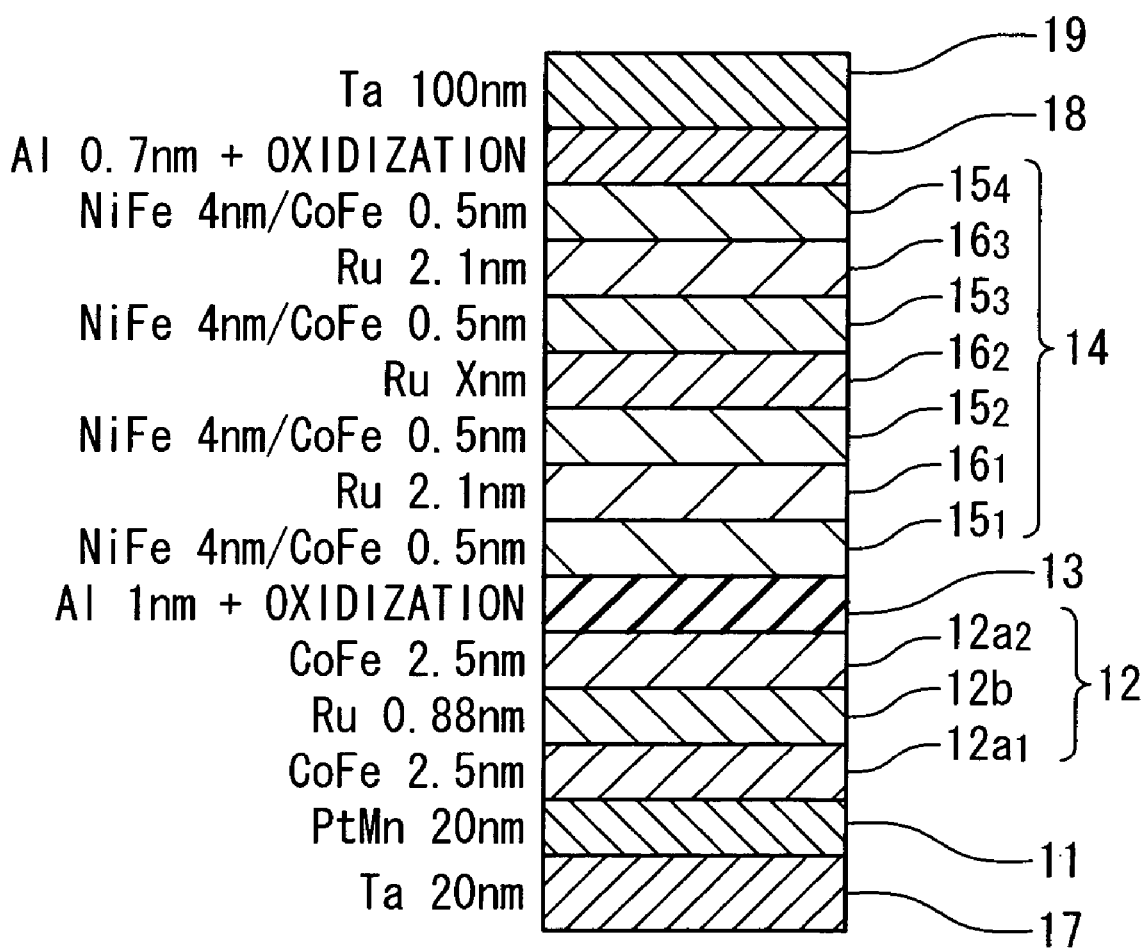
FIG. 24B is a section view illustrating a structure of magnetoresistance elements associated with embodiments of the present invention.

The effect of optimization of the antiferromagnetic couplings described above is experimentally confirmed by using samples structured as shown in FIGS. 24A and 24B.

FIG. 24A is a section view illustrating the structure of a magnetoresistance element corresponding to a comparative sample. The magnetoresistance element corresponding to the comparative sample is composed of a bottom electrode 17, an antiferromagnetic layer 11, a fixed magnetic layer 12, a tunnel barrier 13, a free magnetic layer 214, a cap layer 18, and a top layer 19. The bottom electrode 17 is formed of a 20-nm-thick Ta film, and the antiferromagnetic layer 11 is formed of a 20-nm-thick PtMn film. The fixed magnetic layer 12 is formed of a synthetic antiferromagnet composed of CoFe films $12a_1$ and $12a_2$ separated by a Ru film $12b$. The CoFe films $12a_1$ and $12a_2$ have a thickness of 2.5 nm, and the Ru film $12b$ has a thickness of 0.88 nm. The tunnel barrier 13 is formed through oxidizing a 1-nm-thick aluminum film. The free magnetic layer 214 is formed of a synthetic antiferromagnet composed of a pair of ferromagnetic layers $215_1$ and $215_2$ separated by a non-magnetic layer 216; the ferromagnetic layers $215_1$ and $215_2$ are each composed of a stack of a 4-nm-thick NiFe film and a 0.5-nm-thick CoFe film, and the non-magnetic layer 216 is composed of a 2.1-nm-thick Ru film. The cap layer 18 is formed through oxidizing a 1-nm-thick aluminum film. The top electrode 19 is formed of a 100-nm-thick tantalum film.

FIG. 24B is a section view illustrating the structure of magnetoresistance elements corresponding to embodiments of the present invention. The magnetoresistance elements corresponding to the embodiments of the present invention are different only in the structure of the free magnetic layer from that corresponding to the comparative example. The free magnetic layers 14 within the magnetoresistance elements corresponding to the embodiments of the present invention are each composed of ferromagnetic layers $15_1$ to $15_4$ separated by non-magnetic layers $16_1$ to $16_3$, as presented in the second embodiment. The ferromagnetic layers $15_1$ to $15_4$ are each composed of a stack of a 4-nm-thick NiFe film and a 0.5-nm-thick CoFe film. The non-magnetic layers $16_1$ to $16_3$ are each formed of a Ru film. The non-magnetic layers $16_1$ and $16_3$ each have a thickness of 2.1 nm, while the non-magnetic layers $16_2$, positioned at the middle of the free magnetic layers 14, have a thickness selected out of 0.9 nm and 2.1 nm. The magnetoresistance element with the non-magnetic layers $16_2$ of a 2.1-nm-thick Ru film is a sample for proving the effect of the increased number of the ferromagnetic layers $15_1$ to $15_4$ within the free magnetic layer 14 on the increase in the saturation magnetic field of the free magnetic layer 14, while the magnetoresistance element with the non-magnetic layers $16_2$ of a 0.9-nm-thick Ru film is a sample for proving the effect of optimization of the strengths of the antiferromagnetic couplings on the saturation magnetic field of the free magnetic layer 14.

As shown in FIG. 25, the free magnetic layer 14 within the magnetoresistance element with the non-magnetic layers $16_2$ of a 2.1-nm-thick Ru film exhibits a saturation magnetic field of 1180 [Oe], which exceeds that of the magnetoresistance element of the comparative example. This proves that the increase in the number of the ferromagnetic layers within the free magnetic layer is effective for increasing the saturation magnetic field.

The free magnetic layer 14 within the magnetoresistance element with the non-magnetic layers $16_2$ of a 0.9-nm-thick Ru film exhibits a further increased saturation magnetic field of 2000 [Oe]. This proves that the above-mentioned optimization of the strengths of the antiferromagnetic couplings is effective for further increasing the saturation magnetic field.

As for the spin-flop field of the free magnetic layer, on the other hand, the magnetoresistance elements corresponding to the embodiments of the present invention exhibit no significant difference from that corresponding to the comparative sample. This experimentally proves that the above-mentioned optimization of the strengths of the antiferromagnetic couplings achieves the increase in the saturation magnetic field without causing the increase in the spin-flop field of the free magnetic layer, enlarging the operation range of the magnetic memory.

It is apparent that the present invention is not limited to the above-described embodiments, which may be modified and changed without departing from the scope of the invention.

What is claimed is:

1. A magnetic memory comprising:
  a magnetoresistance element including a free magnetic layer;
  a first interconnection extending in a first direction obliquely to an easy axis of said free magnetic layer;
  a second interconnection extending in a second direction substantially orthogonal to said first direction; and
  a write circuit writing data into said free magnetic layer through developing a first write current on said first interconnection, and then developing a second write current on said second interconnection with said first write current turned on,
  wherein said free magnetic layer includes:
    first to N-th ferromagnetic layers, N being equal to or more than 4; and
    first to (N−1)-th non-magnetic layers, said i-th non-magnetic layer being disposed between said i-th and (i+1)-th ferromagnetic layers, i being any of natural numbers equal to or less than N−1, and
  wherein said free magnetic layer is designed so that antiferromagnetic coupling(s) between said j-th and (j+1)-th ferromagnetic layers is stronger than that between said first and second ferromagnetic layers, j being any of integers ranging from 2 to N−2.

2. The magnetic memory according to claim 1, wherein said free magnetic layer is designed so that said antiferromagnetic coupling(s) between said j-th and (j+1)-th ferromagnetic layers is stronger than that between said (N−1)-th and N-th ferromagnetic layers, j being any of integers ranging from 2 to N−2.

3. A magnetic memory comprising:
  a magnetoresistance element including a free magnetic layer;
  a first interconnection extending in a first direction obliquely to an easy axis of said free magnetic layer;
  a second interconnection extending in a second direction substantially orthogonal to said first direction; and
  a write circuit writing data into said free magnetic layer through developing a first write current on said first interconnection, and then developing a second write current on said second interconnection with said first write current turned on,
  wherein said free magnetic layer includes:
    first to third ferromagnetic layers;
    first non-magnetic layer disposed between said first and second ferromagnetic layers; and
    second non-magnetic layer disposed between second and third ferromagnetic layers, and
  wherein said free magnetic layer is designed so that antiferromagnetic coupling between said first and second ferromagnetic layers is stronger than that between said second and third ferromagnetic layers.

4. A magnetic memory comprising:
  a magnetoresistance element including a free magnetic layer;
  a first interconnection extending in a first direction obliquely to an easy axis of said free magnetic layer;
  a second interconnection extending in a second direction substantially orthogonal to said first direction; and
  a write circuit writing data into said free magnetic layer through developing a first write current on said first interconnection, and then developing a second write current on said second interconnection with said first write current turned on,
  wherein said free magnetic layer includes:
    first to N-th ferromagnetic layers, N being equal to or more than 4; and
    first to (N−1)-th non-magnetic layers, said i-th non-magnetic layer being disposed between said i-th and (i+1)-th ferromagnetic layers, i being any of natural numbers equal to or less than N−1, and
  wherein said first non-magnetic layer has a thickness larger than those of said second to (N−2)-th non-magnetic layers.

5. The magnetic memory according to claim 4, wherein said (N−1)-th non-magnetic layer has a thickness larger than those of said second to (N−2)-th non-magnetic layers.

6. A magnetic memory comprising:
  a magnetoresistance element including a free magnetic layer;
  a first interconnection extending in a first direction obliquely to an easy axis of said free magnetic layer;
  a second interconnection extending in a second direction substantially orthogonal to said first direction; and
  a write circuit writing data into said free magnetic layer through developing a first write current on said first interconnection, and then developing a second write current on said second interconnection with said first write current turned on,
  wherein said free magnetic layer includes:
    first to third ferromagnetic layers;
    first non-magnetic layer disposed between said first and second ferromagnetic layers;
    second non-magnetic layer disposed between said second and third ferromagnetic layers, and
  wherein said first non-magnetic layer has a thickness larger than that of said second non-magnetic layer.

7. A magnetic memory comprising:
  a magnetoresistance element including a free magnetic layer;
  a first interconnection extending in a first direction obliquely to an easy axis of said free magnetic layer;
  a second interconnection extending in a second direction substantially orthogonal to said first direction; and
  a write circuit writing data into said free magnetic layer through developing a first write current on said first interconnection, and then developing a second write current on said second interconnection with said first write current turned on,
  wherein said free magnetic layer includes:
    first to N-th ferromagnetic layers, N being equal to or more than 3;
    first to (N−1)-th non-magnetic layers, said i-th non-magnetic layer being disposed between said i-th and (i+1)-th ferromagnetic layers, i being any of natural numbers equal to or less than N−1, and
  wherein said first ferromagnetic layer is formed of material different from material of said second to (N−1)-th ferromagnetic layers.

8. The magnetic memory according to claim 7, wherein said second to (N−1)-th ferromagnetic layers includes cobalt, and
wherein cobalt concentration of said first ferromagnetic layer is zero or less than those of said second to (N−1)-th ferromagnetic layers.

9. The magnetic memory according to claim 7, wherein said N is equal to or more than 4, and
wherein said N-th ferromagnetic layer is formed of material different from those of said first to (N−1)-th ferromagnetic layers.

10. The magnetic memory according to claim 9, wherein said second to (N−1)-th ferromagnetic layers includes cobalt,
wherein cobalt concentration of said first ferromagnetic layer is zero or less than those of said second to (N−1)-th ferromagnetic layers, and
wherein cobalt concentration of said N-th ferromagnetic layer is zero or less than those of said second to (N−1)-th ferromagnetic layers.

11. A magnetic memory comprising:
a magnetoresistance element including a free magnetic layer;
a first interconnection extending in a first direction obliquely to an easy axis of said free magnetic layer;
a second interconnection extending in a second direction substantially orthogonal to said first direction; and
a write circuit writing data into said free magnetic layer through developing a first write current on said first interconnection, and then developing a second write current on said second interconnection with said first write current turned on,
wherein said free magnetic layer includes:
first to N-th ferromagnetic layers, N being equal to or more than 3;
first to (N−1)-th non-magnetic layers, said i-th non-magnetic layer being disposed between said i-th and (i+1)-th ferromagnetic layers, i being any of natural numbers equal to or less than N−1, and
wherein said first ferromagnetic layer is formed of selected one of a plasma-treated ferromagnetic layer and a surfactant ferromagnetic layer, said plasma-treated ferromagnetic layer being subjected to inert gas plasma, and said surfactant ferromagnetic layer being deposited in an oxygen-including atmosphere.

12. The magnetic memory according to claim 11, wherein said N is equal to or more than 4, and
wherein said N-th ferromagnetic layer is formed of selected one of a plasma-treated ferromagnetic layer and a surfactant ferromagnetic layer, said plasma-treated ferromagnetic layer being subjected to inert gas plasma, and said surfactant ferromagnetic layer being deposited in an oxygen-including atmosphere.

13. A magnetic memory comprising:
a magnetoresistance element including a free magnetic layer;
a first interconnection extending in a first direction obliquely to an easy axis of said free magnetic layer;
a second interconnection extending in a second direction substantially orthogonal to said first direction; and
a write circuit writing data into said free magnetic layer through developing a first write current on said first interconnection, and then developing a second write current on said second interconnection with said first write current turned on,
wherein said free magnetic layer includes:
first to N-th ferromagnetic layers, N being equal to or more than 4;
first to (N−1)-th non-magnetic layers, said i-th non-magnetic layer being disposed between said i-th and (i+1)-th ferromagnetic layers, i being any of natural numbers equal to or less than N−1, and
wherein said first non-magnetic layer is formed of material different from those of said second to (N−2)-th non-magnetic layers.

14. The magnetic memory according to claim 13, wherein said (N−1)-th non-magnetic layer is formed of material different from those of said second to (N−2)-th non-magnetic layers.

15. A magnetic memory comprising:
a magnetoresistance element including a free magnetic layer;
a first interconnection extending in a first direction obliquely to an easy axis of said free magnetic layer;
a second interconnection extending in a second direction substantially orthogonal to said first direction; and
a write circuit writing data into said free magnetic layer through developing a first write current on said first interconnection, and then developing a second write current on said second interconnection with said first write current turned on,
wherein said free magnetic layer includes:
first to third ferromagnetic layers;
first non-magnetic layer disposed between said first and second ferromagnetic layers;
second non-magnetic layer disposed between said second and third ferromagnetic layers, and
wherein said first non-magnetic layer is formed of material different from that of said second non-magnetic layer.

16. A magnetic memory comprising:
a magnetoresistance element including a free magnetic layer;
a first interconnection extending in a first direction obliquely to an easy axis of said free magnetic layer;
a second interconnection extending in a second direction substantially orthogonal to said first direction; and
a write circuit writing data into said free magnetic layer through developing a first write current on said first interconnection, and then developing a second write current on said second interconnection with said first write current turned on,
wherein said free magnetic layer includes:
first to N-th ferromagnetic layers, N being equal to or more than 3;
first to (N−1)-th non-magnetic layers, said i-th non-magnetic layer being disposed between said i-th and (i+1)-th ferromagnetic layers, i being any of natural numbers equal to or less than N−1, and
wherein said first ferromagnetic layer has a thickness thinner than those of said second to (N−1)-th ferromagnetic layers.

17. The magnetic memory according to claim 16, wherein said N is equal to or more than 4, and
wherein said N-th ferromagnetic layer has a thickness thinner than those of said second to (N−1)-th ferromagnetic layers.

18. A magnetic memory comprising:
a magnetoresistance element including a free magnetic layer;
a first interconnection extending in a first direction obliquely to an easy axis of said free magnetic layer;

a second interconnection extending in a second direction substantially orthogonal to said first direction; and a write circuit writing data into said free magnetic layer through developing a first write current on said first interconnection, and then developing a second write current on said second interconnection with said first write current turned on, wherein said free magnetic layer includes:
- first to N-th ferromagnetic layers, N being equal to or more than 3;
- first to (N−1)-th non-magnetic layers, said i-th non-magnetic layer being disposed between said i-th and (i+1)-th ferromagnetic layers, i being any of natural numbers equal to or less than N−1, and wherein said free ferromagnetic layer is designed so that a saturation magnetic field of said free ferromagnetic layer is larger than twice of that of a synthetic antiferromagnet composed of a pair of ferromagnetic layers equivalent to said first and second ferromagnetic layers, and a non-magnetic layer equivalent to said first non-magnetic layer.

19. The magnetic memory according to claim 18, wherein said free ferromagnetic layer is designed so that a magnetization curve of said free ferromagnetic layer is constantly convex upward.

* * * * *